US011637552B2

(12) United States Patent
Kinoshita et al.

(10) Patent No.: US 11,637,552 B2
(45) Date of Patent: Apr. 25, 2023

(54) DRIVER CIRCUIT AND SWITCH SYSTEM

(71) Applicant: Panasonic Intellectual Property Management Co., Ltd., Osaka (JP)

(72) Inventors: Yusuke Kinoshita, Kyoto (JP); Takashi Ichiryu, Osaka (JP); Ryusuke Kanomata, Osaka (JP); Hidetoshi Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/614,716

(22) PCT Filed: Apr. 28, 2020

(86) PCT No.: PCT/JP2020/018104
§ 371 (c)(1),
(2) Date: Nov. 29, 2021

(87) PCT Pub. No.: WO2020/241158
PCT Pub. Date: Dec. 3, 2020

(65) Prior Publication Data
US 2022/0224321 A1    Jul. 14, 2022

(30) Foreign Application Priority Data

May 30, 2019    (JP) .............................. JP2019-101723

(51) Int. Cl.
*H03K 17/04*    (2006.01)
*H03K 19/01*    (2006.01)
*H03K 19/20*    (2006.01)

(52) U.S. Cl.
CPC ............. *H03K 17/04* (2013.01); *H03K 19/01* (2013.01); *H03K 19/20* (2013.01)

(58) Field of Classification Search
CPC .. H03K 17/04; H03K 17/0406; H03K 17/041; H03K 17/04106; H03K 17/06;
(Continued)

(56) References Cited

U.S. PATENT DOCUMENTS 5,160,860 A * 11/1992 Runaldue ............. H03K 17/063
326/98
8,717,068 B2    5/2014 Wasekura
(Continued)

FOREIGN PATENT DOCUMENTS

JP    H05-291939 A    11/1993
JP    2008-066929 A    3/2008
(Continued)

OTHER PUBLICATIONS

International Search Report and Written Opinion issued in International Patent Application No. PCT/JP2020/018104, dated Jul. 14, 2020; with partial English translation.

*Primary Examiner* — Long Nguyen
(74) *Attorney, Agent, or Firm* — McDermott Will & Emery LLP

(57) ABSTRACT

A speed-up circuit is configured to be provided between a power supply terminal and a gate of a semiconductor switching element. An impedance element is configured to be provided between a signal input terminal and a node, the node being between the speed-up circuit and the gate of the semiconductor switching element. In the speed-up circuit, a second field effect transistor is connected in series to a first field effect transistor and is configured to be connected to the gate of the semiconductor switching element. The impedance element has an impedance higher than an impedance of the speed-up circuit when both the first field effect transistor and the second field effect transistor are in an ON state.

15 Claims, 11 Drawing Sheets

(58) Field of Classification Search
CPC .... H03K 17/063; H03K 17/08; H03K 17/081;
H03K 17/08104; H03K 17/10; H03K
17/102; H03K 17/12; H03K 17/122;
H03K 17/687; H03K 17/6871; H03K
17/6872; H03K 17/6874; H03K 19/003;
H03K 19/00315; H03K 19/01; H03K
19/017; H03K 19/01707; H03K
19/01721; H03K 19/20
See application file for complete search history.

(56) References Cited

U.S. PATENT DOCUMENTS

| | | |
|---|---|---|
| 2010/0283515 A1 | 11/2010 | Kelley et al. |
| 2012/0218011 A1 | 8/2012 | Kelley et al. |
| 2014/0062541 A1 | 3/2014 | Wasekura |
| 2018/0248540 A1 | 8/2018 | Ishii et al. |
| 2019/0372570 A1* | 12/2019 | Miyazaki ................ H01L 23/64 |

FOREIGN PATENT DOCUMENTS

| | | |
|---|---|---|
| JP | 2008-193717 A | 8/2008 |
| JP | 2010-051165 A | 3/2010 |
| JP | 2012-527178 A | 11/2012 |
| JP | 2015-204661 A | 11/2015 |
| WO | 2012/157118 A1 | 11/2012 |
| WO | 2017/081856 A1 | 5/2017 |

* cited by examiner

DRIVER CIRCUIT AND SWITCH SYSTEM

CROSS-REFERENCE OF RELATED APPLICATIONS

This application is the U.S. National Phase under 35 U.S.C. § 371 of International Patent Application No. PCT/JP2020/018104, filed on Apr. 28, 2020, which in turn claims the benefit of Japanese Application No. 2019-101723, filed on May 30, 2019, the entire disclosures of which Applications are incorporated by reference herein.

TECHNICAL FIELD

The present disclosure relates to driver circuits and switch systems and specifically relates to a driver circuit for a semiconductor switching element of a current driven type and a switch system including the driver circuit.

BACKGROUND ART

A gate drive circuit for a semiconductor element has been known (Patent Literature 1).

The semiconductor element described in Patent Literature 1 is a gate drive semiconductor element. The semiconductor element is driven based on a signal from a switching circuit. The switching circuit includes the gate drive circuit constituted by a drive circuit and a parallel circuit of a gate resistor and a capacitor.

The drive circuit includes an NPN transistor and a PNP transistor. The gate drive semiconductor element constituting the semiconductor element is a Gate Injection Transistor (GIT).

The gate drive circuit disclosed in Patent Literature 1 achieves high-speed switching by including the capacitor connected in parallel to the gate resistor, and the capacitor thus has to be a capacitor of large capacitance.

CITATION LIST

Patent Literature

Patent Literature 1: JP 2010-51165 A

SUMMARY OF INVENTION

It is an object of the present disclosure to provide a driver circuit and a switch system for reducing a turn-on time of a semiconductor switching element without including a capacitor of large capacitance.

A driver circuit of an aspect according to the present disclosure is a driver circuit for a semiconductor switching element of a current driven type, the semiconductor switching element including a gate and a source corresponding to the gate. The driver circuit includes a power supply terminal, a ground terminal, a signal input terminal, a speed-up circuit, and an impedance element. The ground terminal is configured to be connected to the source of the semiconductor switching element. The speed-up circuit is configured to be provided between the power supply terminal and the gate of the semiconductor switching element. The impedance element is configured to be provided between the signal input terminal and a node, the node being between the speed-up circuit and the gate of the semiconductor switching element. The speed-up circuit includes a first field effect transistor and a second field effect transistor. The second field effect transistor is connected in series to the first field effect transistor and is configured to be connected to the gate of the semiconductor switching element. The impedance element has an impedance higher than an impedance of the speed-up circuit when both the first field effect transistor and the second field effect transistor are in an ON state.

A driver circuit of another aspect according to the present disclosure is a driver circuit of a semiconductor switching element of a current driven type, the semiconductor switching element including a gate and a source corresponding to the gate. The driver circuit includes a power supply terminal, a ground terminal, a signal input terminal, a first field effect transistor, a second field effect transistor, and an impedance element. The ground terminal is configured to be connected to the source of the semiconductor switching element. The first field effect transistor is connected to the power supply terminal. The second field effect transistor is connected in series to the first field effect transistor and is configured to be connected to the gate of the semiconductor switching element. The impedance element is configured to be provided between the signal input terminal and a node, the node being between the second field effect transistor and the gate of the semiconductor switching element. The driver circuit being configured such that when the potential level of a signal input to the signal input terminal changes from a first potential level to a second potential level higher than the first potential level with the second field effect transistor being in an ON state, the first field effect transistor is on, and the driver circuit thus causes a current larger than a current flowing through the impedance element to flow through the gate of the semiconductor switching element such that the gate voltage of the semiconductor switching element is increased to a value higher than a prescribed value higher than a value of the threshold voltage, and thereafter, the driver circuit keeps the current flowing through the gate of the semiconductor switching element via the impedance element such that a gate voltage of the semiconductor switching element has the prescribed value.

A switch system of still another aspect according to the present disclosure includes the driver circuit and the semiconductor switching element.

DESCRIPTION OF EMBODIMENTS

First Embodiment

Figure 1:
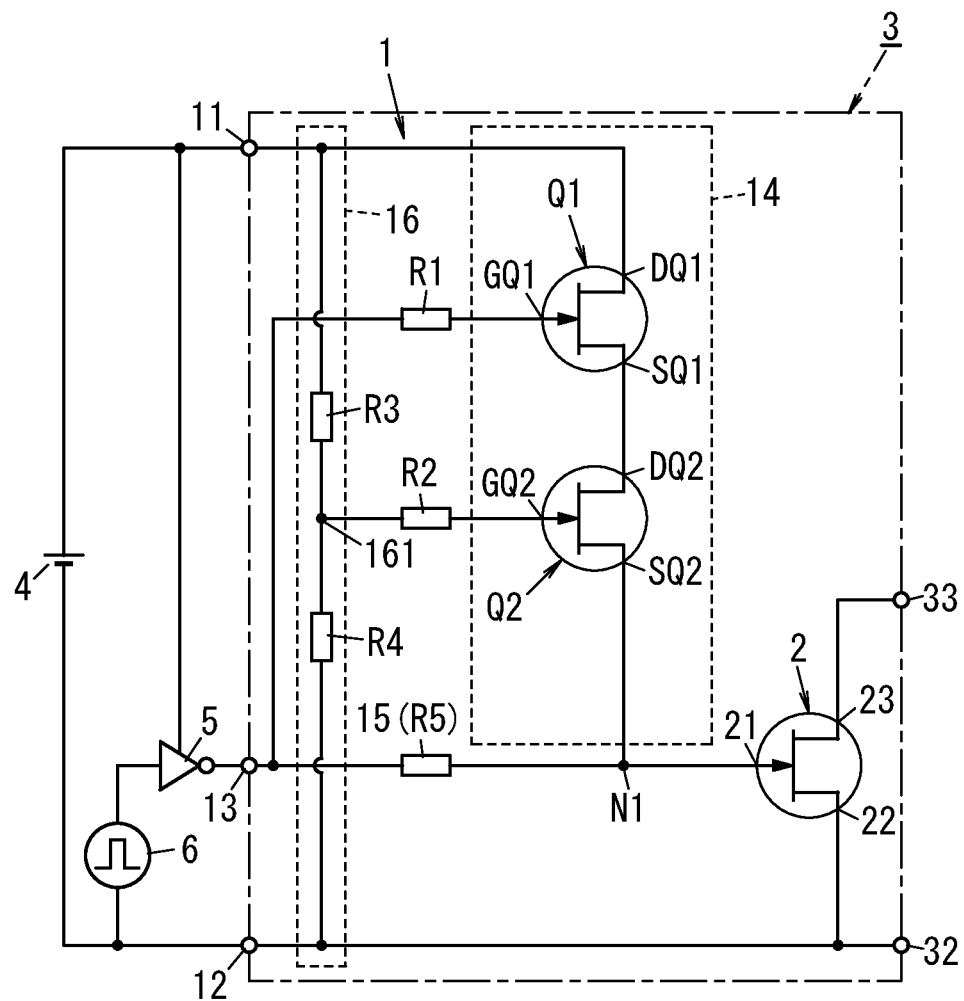
FIG. 1 is a circuit diagram of a switch system including a driver circuit according to a first embodiment.

A driver circuit 1 according to a first embodiment and a switch system 3 including the driver circuit 1 will be described below with reference to FIG. 1.

(1) Overview

The driver circuit 1 is a driver circuit for a semiconductor switching element 2 of a current driven type. The semiconductor switching element 2 includes a gate 21 and a source 22 corresponding to the gate 21. The semiconductor switching element 2 of a current driven type is an element configured to be turned on by a current caused to flow through the gate 21, and the current continues flowing through the gate 21 also after the element is turned on. The semiconductor switching element 2 of a current driven type includes, for example, no Metal-Oxide-Semiconductor Field Effect Transistor (MOSFET).

The switch system 3 includes the driver circuit 1 and the semiconductor switching element 2. The semiconductor switching element 2 further includes a drain 23 in addition to the gate 21 and the source 22. The switch system 3 includes a source terminal 32 and a drain terminal 33 respectively connected to the source 22 and the drain 23 of the semiconductor switching element 2.

(2) Components of Switch System (2.1) Semiconductor Switching Element

The semiconductor switching element 2 is, for example, a GaN-based semiconductor switching element. More specifically, the semiconductor switching element 2 is a GaN-based Gate Injection Transistor (GIT).

The semiconductor switching element 2 includes, for example, a substrate, a buffer layer, a first nitride semiconductor layer, a second nitride semiconductor layer, a source electrode, a gate electrode, a drain electrode, and a p-type layer. The buffer layer is provided on the substrate. The first nitride semiconductor layer is provided on the buffer layer. The second nitride semiconductor layer is provided on the first nitride semiconductor layer. The source electrode, the gate electrode, and the drain electrode are provided on the second nitride semiconductor layer. The p-type layer is provided between the gate electrode and the second nitride semiconductor layer. In the semiconductor switching element 2, the second nitride semiconductor layer and the p-type layer constitute a diode structure. The gate 21 of the semiconductor switching element 2 includes the gate electrode and the p-type layer. The source 22 of the semiconductor switching element 2 includes the source electrode. The drain 23 of the semiconductor switching element 2 includes the drain electrode. The substrate is, for example, a silicon substrate. The buffer layer is, for example, an undoped GaN layer. The first nitride semiconductor layer is, for example, an undoped GaN layer. The second nitride semiconductor layer is, for example, an undoped AlGaN layer. The p-type layer is, for example, a p-type AlGaN layer. Each of the buffer layer, the first nitride semiconductor layer, and the second nitride semiconductor layer may contain an impurity such as Mg, H, Si, C, or O which is inevitably incorporated into the layer during its growth by Metal Organic Vapor Phase Epitaxy (MOVPE) or the like.

(2.2) Driver Circuit (2.2.1) Configuration of Driver Circuit

As illustrated in FIG. 1, the driver circuit 1 according to the first embodiment includes a power supply terminal 11, a ground terminal 12, a signal input terminal 13, a speed-up circuit 14, and an impedance element 15.

The ground terminal 12 is to be connected to the source 22 of the semiconductor switching element 2 of a current driven type, the semiconductor switching element including the gate 21, the source 22, and the drain 23.

The speed-up circuit 14 is to be provided between the power supply terminal 11 and the gate 21 of the semiconductor switching element 2.

The impedance element 15 is to be provided between the signal input terminal 13 and a node N1, the node N1 being between the speed-up circuit 14 and the gate 21 of the semiconductor switching element 2.

The speed-up circuit 14 includes a first field effect transistor Q1 and a second field effect transistor Q2.

The second field effect transistor Q2 is connected in series to the first field effect transistor Q1 and is to be connected to the gate 21 of the semiconductor switching element 2.

The impedance element 15 has an impedance higher than an impedance of the speed-up circuit 14 when both the first field effect transistor Q1 and the second field effect transistor Q2 are in an ON state.

The driver circuit 1 according to the first embodiment further includes a resistor divider 16. The resistor divider 16 is provided between the power supply terminal 11 and the ground terminal 12. In the driver circuit 1 according to the first embodiment, the second field effect transistor Q2 has a gate GQ2 connected to an output end 161 of the resistor divider 16.

(2.2.2) Details of Driver Circuit

Between the power supply terminal 11 and the ground terminal 12 of the driver circuit 1, a direct-current power supply 4 including a high-potential-side output end and a low-potential-side output end is to be connected. To the power supply terminal 11 of the driver circuit 1, the high-potential-side output end of the direct-current power supply 4 is to be connected. To the ground terminal 12 of the driver circuit 1, the low-potential-side output end of the direct-current power supply 4 is to be connected. The output voltage of the direct-current power supply 4 is, for example, 12 V. The direct-current power supply 4 is an insulated power supply. Note that the direct-current power supply 4 is not a component of the driver circuit 1.

Between the signal input terminal 13 and the ground terminal 12 of the driver circuit 1, a series circuit of a driver Integrated Circuit (IC) 5 and a signal source 6 is to be connected. Note that the driver IC 5 and the signal source 6 are not components of the driver circuit 1.

Figure 2:
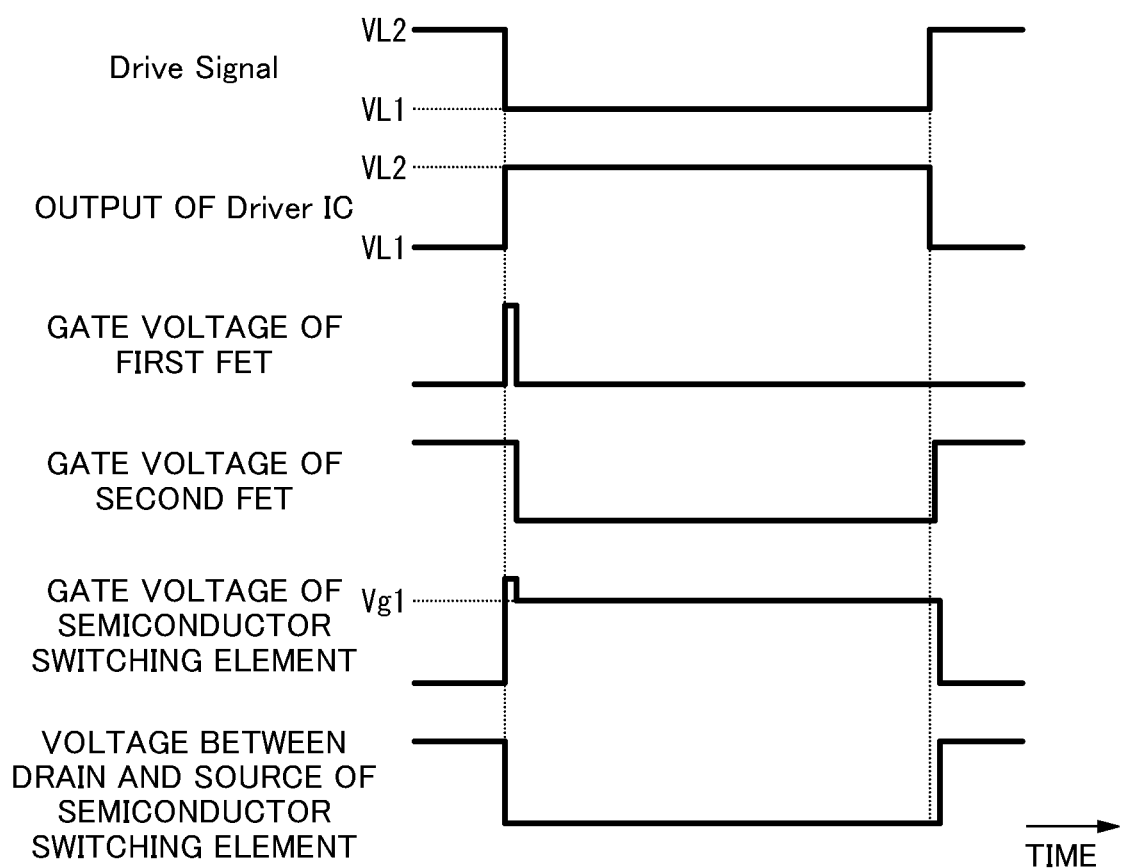
FIG. 2 is a timing diagram illustrating operation of the driver circuit.

The signal source 6 outputs a drive signal (see FIG. 2). The drive signal is, for example, a signal having a potential level changeable between a first potential level VL1 (e.g., 0 V) and a second potential level VL2 (e.g., 12 V). The first potential level VL1 is, for example, a potential level the same as a potential level at the low-potential-side output end of the direct-current power supply 4. The second potential level VL2 is, for example, a potential level the same as a potential level at the high-potential-side output end of the direct-current power supply 4.

The driver IC 5 is, for example, a Complementary Metal-Oxide Semiconductor (CMOS) inverter and includes an anti-series circuit of a p-channel MOSFET and an re-channel MOSFET. The anti-series circuit is connected between the high-potential-side output end and the lowpotential-side output end of the direct-current power supply 4. In the anti-series circuit, drains of the p-channel MOSFET and the n-channel MOSFET are connected to each other, the source of the p-channel MOSFET is connected to the high-potential-side output end of the direct-current power supply 4, and the source of the re-channel MOSFET is connected to the low-potential-side output end of the direct-current power supply 4. When the potential level of the drive signal input to the driver IC 5 from the signal source 6 is the second potential level VL2, the p-channel MOSFET is in an OFF state, and the n-channel MOSFET is in the ON state, and therefore, the potential level of an output signal from the driver IC 5 is the first potential level VL1. When the potential level of the drive signal input to the driver IC 5 from the signal source 6 is the first potential level VL1, the p-channel MOSFET is in the ON state, and the n-channel MOSFET is in the OFF state, and therefore, the potential level of the output signal is the second potential level VL2. In the case of the drive signal and the output signal from the driver IC 5, the second potential level VL2 (e.g., 12 V) corresponds to a logic 1, and the first potential level VL1 (e.g., 0 V) corresponds to a logic 0.

The speed-up circuit 14 is a circuit for turning on the semiconductor switching element 2 at increased speed.

In the speed-up circuit 14, the first field effect transistor Q1 and the second field effect transistor Q2 are connected in series to each other. Each of the first field effect transistor Q1 and the second field effect transistor Q2 is, similarly to the semiconductor switching element 2, a GaN-based GIT. In the driver circuit 1 according to the first embodiment, each of the first field effect transistor Q1 and the second field effect transistor Q2 is a normally-off field effect transistor. The first field effect transistor Q1 includes a gate GQ1, a drain DQ1, and a source SQL The second field effect transistor Q2 includes a gate GQ2, a drain DQ2, and a source SQ2. In the speed-up circuit 14, the source SQ1 of the first field effect transistor Q1 is connected to the drain DQ2 of the second field effect transistor Q2. In the speed-up circuit 14, the drain DQ1 of the first field effect transistor Q1 is connected to the power supply terminal 11. Moreover, in the speed-up circuit 14, the source SQ2 of the second field effect transistor Q2 is connected to the gate 21 of the semiconductor switching element 2.

Each of the first field effect transistor Q1 and the second field effect transistor Q2 has a current capacity smaller than the current capacity of the semiconductor switching element 2. Each of the first field effect transistor Q1 and the second field effect transistor Q2 has a gate width smaller than the gate width of the semiconductor switching element 2. The gate width of the second field effect transistor Q2 is, for example, substantially equal to the gate width of the first field effect transistor Q1 but may be equal to or different from the gate width of the first field effect transistor Q1.

The first field effect transistor Q1 is an element for causing, when the speed-up circuit 14 turns on the semiconductor switching element 2, a current (gate current) larger than that in a steady ON state to flow through the gate 21 of the semiconductor switching element 2, thereby temporarily increasing the gate voltage of the semiconductor switching element 2 to a value higher than a prescribed value Vg1 (see FIG. 2) higher than the value of a threshold voltage.

In the driver circuit 1, the second field effect transistor Q2 is brought into the ON state to turn on the semiconductor switching element 2, and then, the second field effect transistor Q2 is turned off.

The driver circuit 1 further includes a first gate resistor R1 and a second gate resistor R2. The first gate resistor R1 has one end connected to the signal input terminal 13. The first gate resistor R1 has the other end connected to the gate GQ1 of the first field effect transistor Q1. The second gate resistor R2 has one end connected to the output end 161 of the resistor divider 16. The second gate resistor R2 has the other end connected to the gate GQ2 of the second field effect transistor Q2. From the viewpoint that the first field effect transistor Q1 is turned on at high speed, the first gate resistor R1 has a resistance value lower than the resistance value of the second gate resistor R2.

The impedance element 15 is to be provided between the signal input terminal 13 and the node N1 between the speed-up circuit 14 and the gate 21 of the semiconductor switching element 2. The impedance element 15 has one end connected to the node N1. The impedance element 15 has the other end connected to the signal input terminal 13. The impedance element 15 is an element for determining a gate voltage (the prescribed value Vg1) to be applied between the gate 21 and the source 22 of the semiconductor switching element 2 in the steady ON state of the semiconductor switching element 2. The impedance element 15 is, for example, a resistor R5. The resistance value of the resistor R5 is determined such that a gate current for turning on the semiconductor switching element 2 flows through the gate 21 of the semiconductor switching element 2. The magnitude relationship between the resistance value of the second gate resistor R2 and the resistance value of the resistor R5 is decided to be opposite to the magnitude relationship between the gate width of the second field effect transistor Q2 and the gate width of the semiconductor switching element 2.

The resistor divider 16 is a series circuit of a resistor R3 and a resistor R4 and is provided between the power supply terminal 11 and the ground terminal 12 with the resistor R3 being at the side of the power supply terminal 11 and the resistor R4 being at the side of the ground terminal 12. The output end 161 of the resistor divider 16 is a connection point at which the resistor R3 and the resistor R4 are connected to each other. In the resistor divider 16, the ratio between the resistance value of the resistor R3 and the resistance value of the resistor R4 is determined such that a voltage for turning on the second field effect transistor Q2 can be output from the output end 161. In a state where the direct-current power supply 4 is connected between the power supply terminal 11 and the ground terminal 12, a current steadily flows through the resistor R3 and the resistor R4 of the resistor divider 16, and thus, a low resistance value of each of the resistor R3 and the resistor R4 results in an increased electric power loss of the direct-current power supply 4. In terms of reducing the electric power loss of the direct-current power supply 4, each of the resistors R3 and R4 therefore preferably has a high resistance value. However, in terms of increasing the gate voltage of the second field effect transistor Q2 to stabilize operation of the second field effect transistor Q2, the resistance value of each of the resistors R3 and R4 should not be increased to an excessively high value.

In the driver circuit 1, for example, the resistance value of the second gate resistor R2 is made substantially equal to the resistance value of the resistor R3 of the resistor divider 16, which increases a time until the second field effect transistor Q2 is turned off when the semiconductor switching element 2 is turned on. This increases a time in which the gate voltage of the semiconductor switching element 2 may be temporarily increased to a value higher than the prescribed value Vg1 and may further increase the turn-on speed of the semiconductor switching element 2. Moreover, while the gate voltage of the semiconductor switching element 2 has a value higher than the prescribed value Vg1, the driver circuit 1 may increase the drain current flowing through the semiconductor switching element 2 to be larger than the drain current in the case of the gate voltage having the prescribed value Vg1. In this way, the driver circuit 1 earns a time necessary to cause an inrush current to completely flow depending on the application thereof.

Described below is an example of the gate width and the circuit constant of each of the semiconductor switching element 2, the first field effect transistor Q1, and the second field effect transistor Q2 in the switch system 3 when the output voltage of the direct-current power supply 4 is, for example, 12 V.

The gate width of the semiconductor switching element 2 is, for example, 400 mm. The gate width of the first field effect transistor Q1 is, for example, 10 mm. The gate width of the second field effect transistor Q2 is, for example, 10 mm.

The resistance value of the first gate resistor R1 is, for example, 100Ω. The resistance value of the second gate resistor R2 is, for example, 1 kΩ to 10 kΩ.

The resistance value of the resistor R3 is, for example, 5 kΩ The resistance value of the resistor R4 is, for example, 2 kΩ The resistance value of the resistor R5 constituting the impedance element 15 is, for example, 500Ω.

(3) Operation of Driver Circuit and Switch System Including Driver Circuit

The driver circuit 1 according to the first embodiment includes the power supply terminal 11, the ground terminal 12, the signal input terminal 13, the first field effect transistor Q1, the second field effect transistor Q2, and the impedance element 15 (resistor R5) as described above.

FIG. 2 is a timing diagram schematically illustrating the relationship among the drive signal input to the signal source 6, the output signal from the driver IC 5, the gate voltage of the first field effect transistor Q1, the gate voltage of the second field effect transistor Q2, the gate voltage of the semiconductor switching element 2, and the voltage between the drain 23 and the source 22 of the semiconductor switching element 2.

According to the first embodiment, when the potential level of a signal (the output signal from the driver IC 5) input to the signal input terminal 13 changes from the first potential level VL1 to the second potential level VL2 higher than the first potential level VL1 with the second field effect transistor Q2 being in the ON state, the first field effect transistor Q1 is on, and the driver circuit 1 thus causes a current (e.g., 1 A) larger than a current (e.g., 1 mA) flowing through the impedance element 15 to flow through the gate 21 of the semiconductor switching element 2 such that the gate voltage of the semiconductor switching element 2 is increased to a value higher than the prescribed value Vg1 higher than the value of the threshold voltage of the semiconductor switching element 2, and thereafter, the driver circuit 1 keeps the current flowing through the gate 21 of the semiconductor switching element 2 via the impedance element 15 such that the semiconductor switching element 2 is in the normally ON state.

(4) Advantages

The driver circuit 1 and the switch system 3 according to the first embodiment include the speed-up circuit 14 including the first field effect transistor Q1 and the second field effect transistor Q2 and can thus reduce the turn-on time of the semiconductor switching element 2 without including a capacitor of large capacitance.

Moreover, when the driver circuit 1 according to the first embodiment is configured as a monolithic integrated circuit, the driver circuit 1 does not have to be provided with a capacitor of large capacitance and is thus downsized. Moreover, when the switch system 3 according to the first embodiment is configured as a monolithic integrated circuit, the switch system 3 does not have to be provided with a capacitor of large capacitance and is thus downsized.

Second Embodiment

Figure 3:
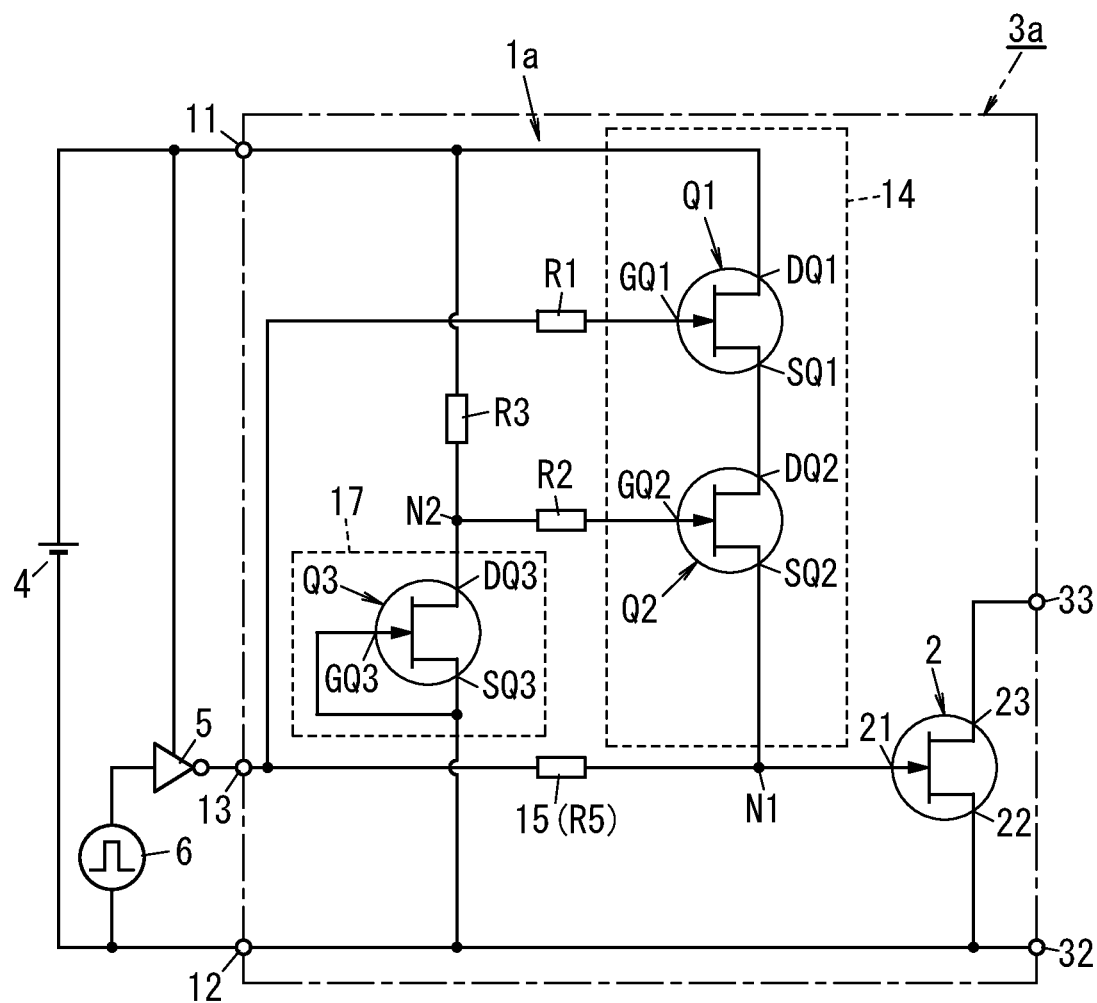
FIG. 3 is a circuit diagram of a switch system including a driver circuit according to a second embodiment.

A driver circuit 1a according to a second embodiment and a switch system 3a including the driver circuit 1a will be described below with reference to FIG. 3.

The driver circuit 1a according to the second embodiment is substantially the same as the driver circuit 1 (see FIG. 1) according to the first embodiment but is different from the driver circuit 1 according to the first embodiment in that the driver circuit 1a includes a constant current circuit 17 in place of the resistor R4 of the driver circuit 1. In the driver circuit 1a and the switch system 3a according to the second embodiment, components similar to those of the driver circuit 1 and the switch system 3 according to the first embodiment are denoted by the same reference signs as those in the first embodiment, and the description thereof is omitted.

The driver circuit 1a according to the second embodiment includes a series circuit of a resistor R3 and the constant current circuit 17 in place of the resistor divider 16 of the driver circuit 1 according to the first embodiment. The resistor R3 is connected to a power supply terminal 11. The constant current circuit 17 is provided between the resistor R3 and a ground terminal 12.

The driver circuit 1a includes a second field effect transistor Q2 having a gate GQ2 connected to a node N2 between the resistor R3 and the constant current circuit 17.

The constant current circuit 17 includes, for example, a field effect transistor Q3 including a gate GQ3, a drain DQ3, and a source SQ3 and is configured by short-circuiting the gate GQ3 and the source SQ3 of the field effect transistor Q3. In the constant current circuit 17, the drain DQ3 of the field effect transistor Q3 is connected to the resistor R3, and the source SQ3 of the field effect transistor Q3 is connected to the ground terminal 12. The field effect transistor Q3 is, for example, a GaN-based GIT.

The driver circuit 1a and the switch system 3a according to the second embodiment, similarly to the driver circuit 1 and the switch system 3 according to the first embodiment, include a speed-up circuit 14 and can thus reduce the turn-on time of the semiconductor switching element 2 without including a capacitor of large capacitance.

Moreover, the driver circuit 1a according to the second embodiment can suppress a current, which flows from a direct-current power supply 4 configured to be connected between the power supply terminal 11 and the ground terminal 12 through the power supply terminal 11 and a first field effect transistor Q1 to the second field effect transistor Q2, to the current of the constant current circuit 17, and the driver circuit 1a can thus reduce the electric power loss.

Third Embodiment

Figure 4:
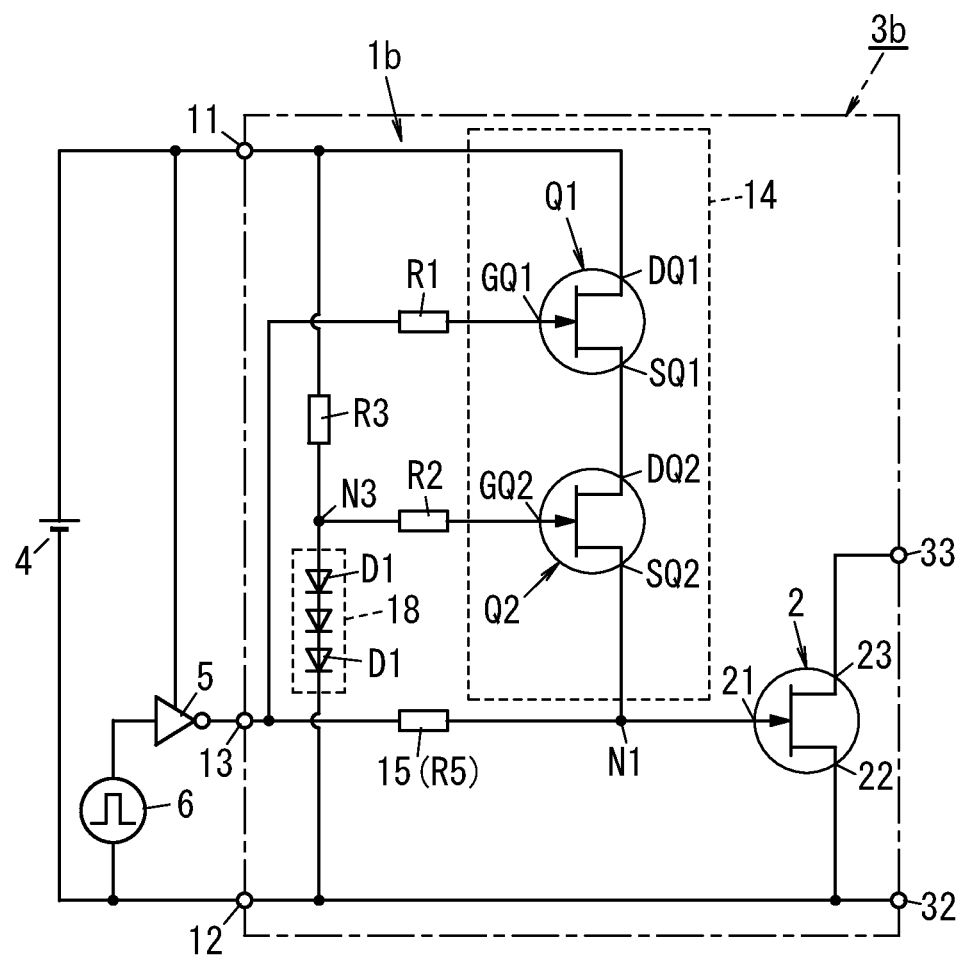
FIG. 4 is a circuit diagram of a switch system including a driver circuit according to a third embodiment.

A driver circuit 1b according to a third embodiment and a switch system 3b including the driver circuit 1b will be described below with reference to FIG. 4.

The driver circuit 1b according to the third embodiment is substantially the same as the driver circuit 1 (see FIG. 1) according to the first embodiment but is different from the driver circuit 1 according to the first embodiment in that the driver circuit 1b includes a constant voltage circuit 18 in place of the resistor R4. In the driver circuit 1b and the switch system 3b according to the third embodiment, components similar to those of the driver circuit 1 and the switch system 3 according to the first embodiment are denoted by the same reference signs as those in the first embodiment, and the description thereof is omitted.

The driver circuit 1b according to the third embodiment includes a series circuit of a resistor R3 and the constant voltage circuit 18 in place of the resistor divider 16 of the driver circuit 1 according to the first embodiment. The resistor R3 is connected to a power supply terminal 11. The constant voltage circuit 18 is provided between the resistor R3 and a ground terminal 12. In the driver circuit 1b, a node N3 between the resistor R3 and the constant voltage circuit 18 is connected to a gate GQ2 of a second field effect transistor Q2.

The constant voltage circuit 18 includes a plurality of diodes D1 connected in series to each other. Of the plurality of diodes D1 constituting the constant voltage circuit 18, a diode D1 closest to the resistor R3 in the driver circuit 1b has an anode connected to the resistor R3, and a diode D1 farthest from the resistor R3 in the driver circuit 1b has a cathode connected to the ground terminal 12. The number of diodes D1 connected in series to each other in the constant voltage circuit 18 is determined such that the sum of forward voltages (Vf) of the plurality of diodes D1 is greater than the threshold voltage of the second field effect transistor Q2 and the second field effect transistor Q2 is not broken.

The driver circuit 1b and the switch system 3b according to the third embodiment, similarly to the driver circuit 1 and the switch system 3 according to the first embodiment, include a speed-up circuit 14 and can thus reduce the turn-on time of the semiconductor switching element 2 without including a capacitor of large capacitance.

The driver circuit 1b according to the third embodiment includes the constant voltage circuit 18, and therefore, regardless of the magnitude of a voltage applied between the power supply terminal 11 and the ground terminal 12, the driver circuit 1b can suppress an excessively large gate voltage from being applied to the second field effect transistor Q2.

Fourth Embodiment

Figure 5:
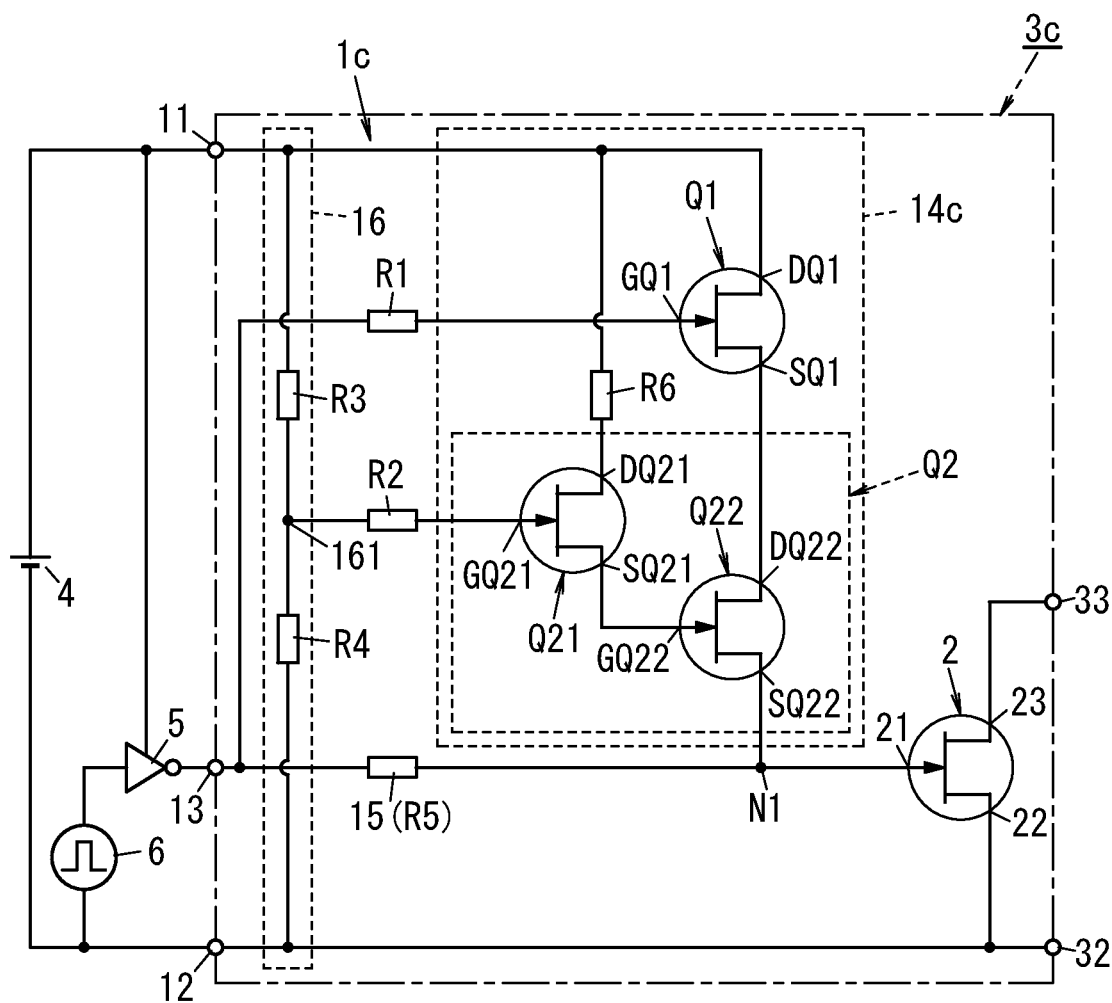
FIG. 5 is a circuit diagram of a switch system including a driver circuit according to a fourth embodiment.

A driver circuit 1c according to a fourth embodiment and a switch system 3c including the driver circuit 1c will be described below with reference to FIG. 5.

The driver circuit 1c according to the fourth embodiment is substantially the same as the driver circuit 1 (see FIG. 1) according to the first embodiment but is different from the driver circuit 1 according to the first embodiment in that the driver circuit 1c includes a speed-up circuit 14c in place of the speed-up circuit 14. In the driver circuit 1c and the switch system 3c according to the fourth embodiment, components similar to those of the driver circuit 1 and the switch system 3 according to the first embodiment are denoted by the same reference signs as those in the first embodiment, and the description thereof is omitted.

The speed-up circuit 14c includes a second field effect transistor Q2 including a third field effect transistor Q21 and a fourth field effect transistor Q22 in Darlington connection. Thus, the speed-up circuit 14c includes: a first field effect transistor Q1; and the second field effect transistor Q2 including a Darlington circuit of the third field effect transistor Q21 and the fourth field effect transistor Q22. Each of the third field effect transistor Q21 and the fourth field effect transistor Q22 is, for example, a GaN-based GIT.

The third field effect transistor Q21 includes a gate GQ21, a drain DQ21, and a source SQ21. The fourth field effect transistor Q22 includes a gate GQ22, a drain DQ22, and a source SQ22. The current capacity of the fourth field effect transistor Q22 is greater than the current capacity of the third field effect transistor Q21. In this embodiment, the gate width of the fourth field effect transistor Q22 is greater than the gate width of the third field effect transistor Q21. For example, when a semiconductor switching element 2, similarly to the switch system 3 according to the first embodiment, has a gate width of 400 mm, the gate width of the fourth field effect transistor Q22 in the driver circuit 1c and the switch system 3c according to the fourth embodiment is the same as the gate width of, for example, the first field effect transistor Q1 and is, for example, 10 mm. In contrast, the third field effect transistor Q21 has a gate width of, for example, 1 mm.

In the speed-up circuit 14c, the gate GQ21 of the third field effect transistor Q21 is connected to an output end 161 of a resistor divider 16. The source SQ22 of the fourth field effect transistor Q22 is to be connected to a gate 21 of the semiconductor switching element 2.

The driver circuit 1c and the switch system 3c according to the fourth embodiment include the speed-up circuit 14c, and therefore, the turn-on time of the semiconductor switching element 2 can be reduced without including a capacitor of large capacitance.

Moreover, in the driver circuit 1c according to the fourth embodiment, the current amplification factor of the second field effect transistor Q2 can be increased more than in the driver circuit 1 of the first embodiment, and therefore, the resistance values of resistors R3 and R4 of the resistor divider 16 can be increased. Thus, in the driver circuit 1c according to the fourth embodiment, the electric power loss can be reduced.

Fifth Embodiment

Figure 6:
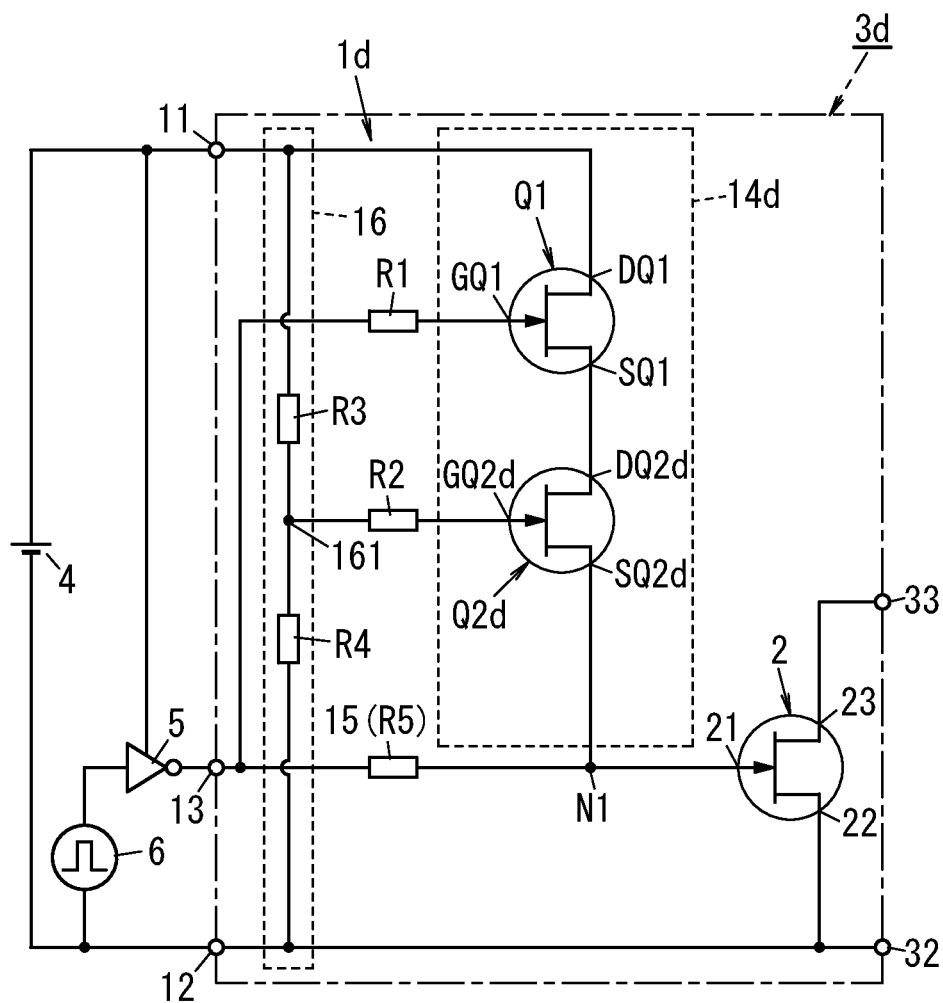
FIG. 6 is a circuit diagram of a switch system including a driver circuit according to a fifth embodiment.

A driver circuit 1d according to a fifth embodiment and a switch system 3d including the driver circuit 1d will be described below with reference to FIG. 6.

The driver circuit 1d according to the fifth embodiment is substantially the same as the driver circuit 1 (see FIG. 1) according to the first embodiment but is different from the driver circuit 1 according to the first embodiment in that the driver circuit 1d includes a speed-up circuit 14d in place of the speed-up circuit 14. In the driver circuit 1d and the switch system 3d according to the fifth embodiment, components similar to those of the driver circuit 1 and the switch system 3 according to the first embodiment are denoted by the same reference signs as those in the first embodiment, and the description thereof is omitted.

The speed-up circuit 14d includes a second field effect transistor Q2d of a normally on-type in place of the second field effect transistor Q2 of a normally off-type of the speed-up circuit 14. The second field effect transistor Q2d is a GaN-based GIT. The second field effect transistor Q2d includes a gate GQ2d, a drain DQ2d, and a source SQ2d. The gate GQ2 of the second field effect transistor Q2 of a normally off-type, similarly to the gate 21 of the semiconductor switching element 2, includes a p-type layer. In contrast, the gate GQ2d of the second field effect transistor Q2d of a normally on-type has a recessed structure in, for example, the surface of a second nitride semiconductor layer (e.g., undoped AlGaN layer) under a gate 21, and therefore, the thickness of the second nitride semiconductor layer is less under the gate 21 than under a source 22. The gate GQ2d of the second field effect transistor Q2d of a normally on-type does not have to include the p-type layer but may have a gate electrode which forms a Schottky junction with the second nitride semiconductor layer.

The driver circuit 1d and the switch system 3d according to the fifth embodiment include the speed-up circuit 14d, and therefore, the turn-on time of the semiconductor switching element 2 can be reduced without including a capacitor of large capacitance.

Moreover, the driver circuit 1d according to the fifth embodiment can increase the gate voltage of the first field effect transistor Q1 even in the case of a low output voltage (e.g., 5 V) of a direct-current power supply 4 because the second field effect transistor Q2d of the speed-up circuit 14d is a normally-on field effect transistor.

It is assumed that in the switch system 3 according to the first embodiment, for example, the second field effect transistor Q2 and the semiconductor switching element 2 each have a threshold voltage of +2 V, and the prescribed value Vg1 is +3 V. In this case, the turn-on speed of the semiconductor switching element 2 cannot be increased when the direct-current power supply 4 has an output voltage of 5 V. It is assumed that the gate voltage is 3 V with the second field effect transistor Q2 being in the ON state. In this case, turning on of the semiconductor switching element 2 causes a current to flow through the first field effect transistor Q1 and the second field effect transistor Q2, thereby increasing the gate voltage of the semiconductor switching element 2. However, at a time point at which the gate voltage of the semiconductor switching element 2 reaches 1 V, the second field effect transistor Q2 is turned off, and therefore, the gate voltage of the semiconductor switching element 2 slowly increases to a prescribed value Vg1 (e.g., 3 V).

In contrast, it is assumed that in the switch system 3d according to the fifth embodiment, for example, the second field effect transistor Q2d and the semiconductor switching element 2 respectively have threshold voltages of −3 V and +2 V, and the prescribed value Vg1 is +3 V. In this case, the turn-on speed of the semiconductor switching element 2 can be increased also when the direct-current power supply 4 has an output voltage of 5 V. It is assumed that the gate voltage is 1 V with the second field effect transistor Q2d being in the ON state. In this case, turning on of the semiconductor switching element 2 causes a current to flow through the first field effect transistor Q1 and the second field effect transistor Q2d, thereby increasing the gate voltage of the semiconductor switching element 2. At a time point at which the gate voltage of the semiconductor switching element 2 reaches 4 V, the second field effect transistor Q2d is turned off, and therefore, the gate voltage of the semiconductor switching element 2 slowly decreases to the prescribed value Vg1 (3 V). Thus, in the driver circuit 1d and the switch system 3d according to the fifth embodiment, the gate voltage of the semiconductor switching element 2 can be temporarily increased to a value higher than the prescribed value Vg1 when the semiconductor switching element 2 is turned on, and the turn-on time can be reduced.

Sixth Embodiment

Figure 7:
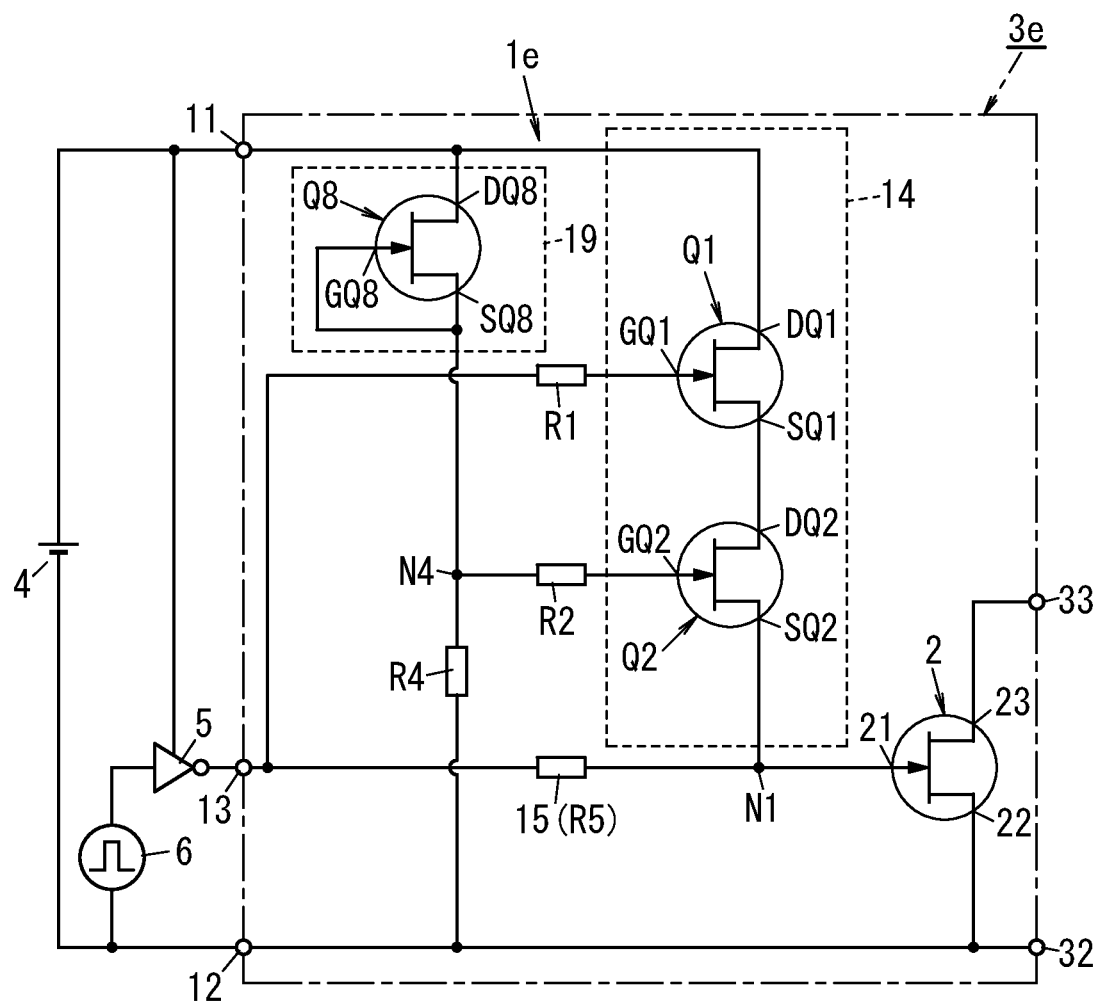
FIG. 7 is a circuit diagram of a switch system including a driver circuit according to a sixth embodiment.

A driver circuit 1e according to a sixth embodiment and a switch system 3e including the driver circuit 1e will be described below with reference to FIG. 7.

The driver circuit 1e according to the sixth embodiment is substantially the same as the driver circuit 1 (FIG. 1) according to the first embodiment but is different from the driver circuit 1 according to the first embodiment in that the driver circuit 1e includes a constant current circuit 19 in place of the resistor R3. In the driver circuit 1e and the switch system 3e according to the sixth embodiment, components similar to those of the driver circuit 1 and the switch system 3 according to the first embodiment are denoted by the same reference signs as those in the first embodiment, and the description thereof is omitted.

The driver circuit 1e according to the sixth embodiment includes a series circuit of the constant current circuit 19 and a resistor R4 in place of the resistor divider 16 of the driver circuit 1 according to the first embodiment. The constant current circuit 19 is connected to a power supply terminal 11. The resistor R4 is connected between the constant current circuit 19 and a ground terminal 12. The driver circuit 1e includes a second field effect transistor Q2 including a gate GQ2 connected to a node N4 between the constant current circuit 19 and the resistor R4.

Figure 8:
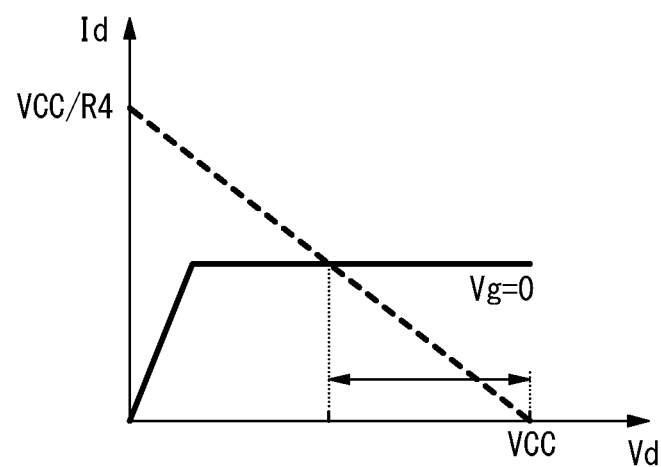
FIG. 8 is a view illustrating operation of a constant current circuit of the driver circuit according to the sixth embodiment.

The constant current circuit 19 includes, for example, a field effect transistor Q8 including a gate GQ8, a drain DQ8, and a source SQ8 and is configured by short-circuiting the gate GQ8 and the source SQ8 of the field effect transistor Q8. In the constant current circuit 19, the drain DQ8 of the field effect transistor Q8 is connected to the power supply terminal 11, and the source SQ8 of the field effect transistor Q8 is connected to the resistor R4. The field effect transistor Q8 is, for example, a GaN-based GIT. Since the gate GQ8 and the source SQ8 are short-circuited, the field effect transistor Q8 has a voltage-current characteristic as shown by the solid line in FIG. 8, where the drain voltage is Vd, and the drain current is Id. In FIG. 8, "VCC" is the output voltage of a direct-current power supply 4. Moreover, "VCC/R4" in FIG. 8 is a value obtained by dividing the output voltage of the direct-current power supply 4 by the resistance value of the resistor R4. In FIG. 8, from an intersecting point at which the straight line connecting the VCC/R4 and the VCC to each other intersects with the solid line representing the voltage-current characteristic, a perpendicular extends downward to the abscissa (drain voltage), and a difference between the VCC and an intersecting point at which the perpendicular intersects with the abscissa is a maximum value of the gate voltage of the second field effect transistor Q2.

The driver circuit 1e and the switch system 3e according to the sixth embodiment, similarly to the driver circuit 1 and the switch system 3 according to the first embodiment, include a speed-up circuit 14 and can thus reduce the turn-on time of the semiconductor switching element 2 without including a capacitor of large capacitance.

Moreover, since the driver circuit 1e according to the sixth embodiment includes the constant current circuit 19, the driver circuit 1e can suppress a current flowing through the second field effect transistor Q2 also when the output voltage of the direct-current power supply 4 changes, and therefore, the electric power loss of the driver circuit 1e can be reduced, and the gate voltage of the second field effect transistor Q2 can be stabilized.

Seventh Embodiment

Figure 9:
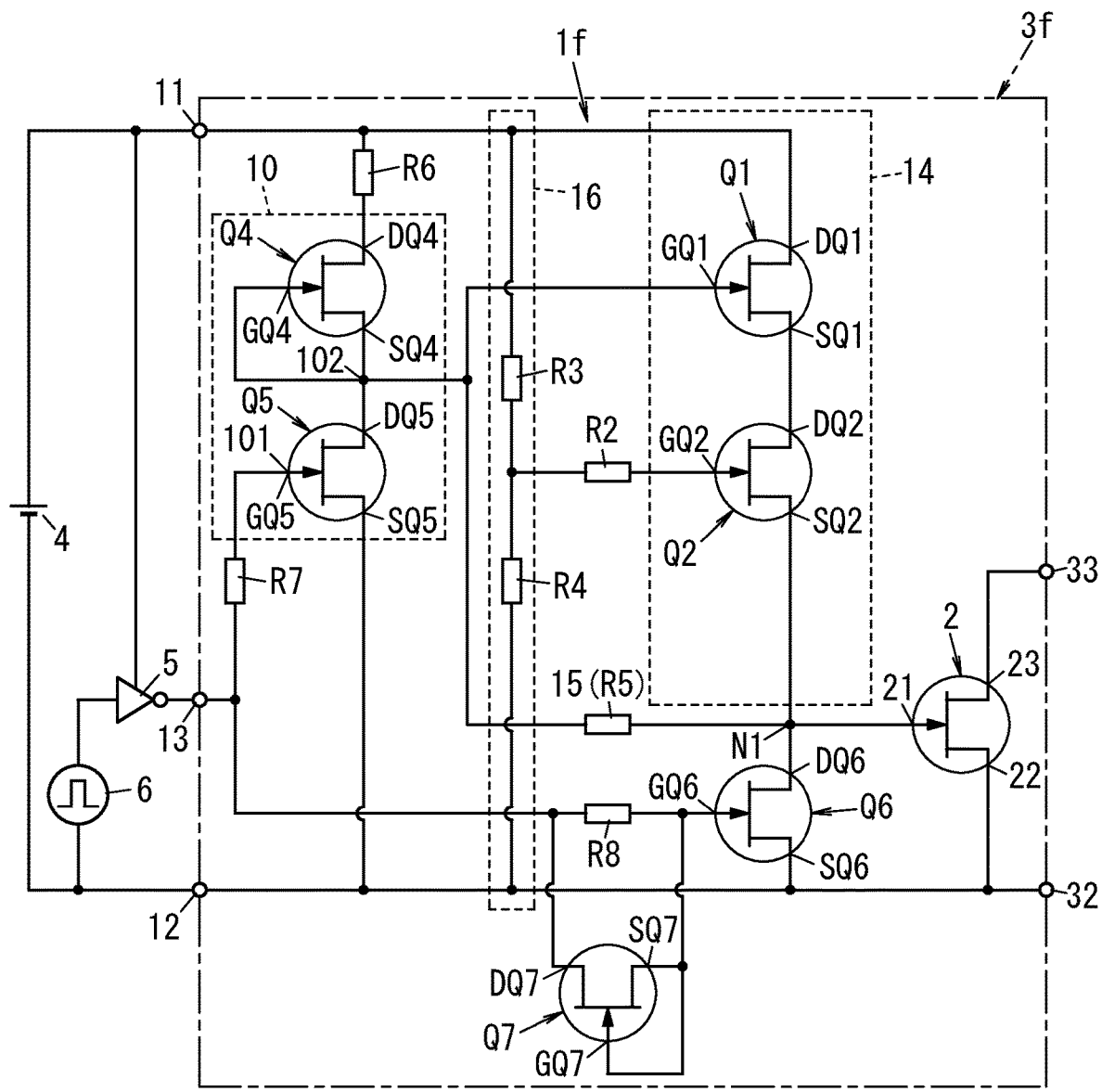
FIG. 9 is a circuit diagram of a switch system including a driver circuit according to a seventh embodiment.

A driver circuit 1f according to a seventh embodiment and a switch system 3f including the driver circuit 1f will be described below with reference to FIG. 9.

The driver circuit 1f according to the seventh embodiment is substantially the same as the driver circuit 1 according to the first embodiment but is different from the driver circuit 1 according to the first embodiment in that the driver circuit 1f further includes a Direct Coupled FET Logic (DCFL) circuit 10. In the driver circuit 1f and the switch system 3f according to the seventh embodiment, components similar to those of the driver circuit 1 and the switch system 3 according to the first embodiment are denoted by the same reference signs as those in the first embodiment, and the description thereof is omitted.

The DCFL circuit 10 includes an input end 101 and an output end 102 and is connected between a power supply terminal 11 and a ground terminal 12.

In the driver circuit 1f, the input end 101 of the DCFL circuit 10 is connected to a signal input terminal 13. Moreover, in the driver circuit 1f, the output end 102 of the DCFL circuit 10 is to be connected via an impedance element 15 to a gate 21 of a semiconductor switching element 2.

The DCFL circuit 10 is a logic circuit including a field effect transistor Q4 and a field effect transistor Q5. The field effect transistor Q4 includes a gate GQ4, a drain DQ4, and a source SQ4. The field effect transistor Q5 includes a gate GQ5, a drain DQ5, and a source SQ5. The field effect transistor Q4 is a normally-on GaN-based GIT. The field effect transistor Q5 is a normally-off GaN-based GIT.

In the DCFL circuit 10, the gate GQ4 and the source SQ4 of the field effect transistor Q4 are short-circuited, and the field effect transistor Q4 operates as a constant current element.

In the field effect transistor Q5, the gate GQ5 is connected to the signal input terminal 13. In the DCFL circuit 10, the gate GQ5 of the field effect transistor Q5 constitutes the input end 101, and a connection point between the source SQ4 of the field effect transistor Q4 and the drain DQ5 of the field effect transistor Q5 constitutes the output end 102 of the DCFL circuit 10.

The DCFL circuit 10 outputs an output logic 0 from the output end 102 when the input logic at the input end 101 is 1. The DCFL circuit 10 outputs an output logic 1 from the output end 102 when the input logic of the input end 101 is 0. In the DCFL circuit 10, a potential level greater than or equal to the threshold voltage of the field effect transistor Q5 is defined as the input logic 1, and a potential level less than the threshold voltage of the field effect transistor Q5 is defined as the input logic 0. In this case, if the input logic is 1, the field effect transistor Q5 is in the ON state, and the output end 102 has substantially the same potential as the ground terminal 12.

In the DCFL circuit 10, the impedance with the field effect transistor Q5 being in the ON state is less than the impedance with the field effect transistor Q4 being in the ON state so that the output logic is 0 when the input logic is 1. In this embodiment, the gate width of the field effect transistor Q5 is greater than the gate width of the field effect transistor Q4.

Moreover, the driver circuit 1f further includes a resistor R6 provided between the DCFL circuit 10 and the power supply terminal 11, but this should not be construed as limiting. If the resistance value of the resistor R6 is greater than the resistance value of a resistor R5, the resistance value of the resistor R6 determines the gate voltage of the semiconductor switching element 2 in a steady ON state, and thus, the circuit has to be carefully designed.

Moreover, the driver circuit 1f further includes a gate resistor R7 provided between the gate GQ5 of the field effect transistor Q5 and the signal input terminal 13. The gate resistor R7 is provided to prevent the gate GQ5 of the field effect transistor Q5 from being broken by an overvoltage due to direct connection of the gate GQ5 to a driver IC 5.

The driver circuit 1f further includes a field effect transistor Q6 which is to be provided between a node N1 and the ground terminal 12. The field effect transistor Q6 includes a gate GQ6, a drain DQ6, and a source SQ6. The field effect transistor Q6 is a normally-off GaN-based GIT. The field effect transistor Q6 is an element provided to increase the turn-off speed of the semiconductor switching element 2. The drain DQ6 is to be connected to the gate of the semiconductor switching element 2. The source SQ6 is to be connected to a source 22 of the semiconductor switching element 2. The field effect transistor Q6 is provided to form a pathway as a pathway for draining gate electric charges from the semiconductor switching element 2 when the semiconductor switching element 2 is turned off. The pathway does not pass through the impedance element 15.

Moreover, the driver circuit 1f further includes a gate resistor R8 provided between the gate GQ6 of the field effect transistor Q6 and the signal input terminal 13. The gate resistor R8 is provided to prevent the gate GQ6 of the field effect transistor Q6 from being broken by an overvoltage due to direct connection of the gate GQ6 to the driver IC 5. In terms of increasing the turn-on speed of the field effect transistor Q6 so as to increase the turn-off speed of the semiconductor switching element 2, the gate resistor R8 preferably has a low resistance value.

Moreover, the driver circuit 1f further includes a field effect transistor Q7 connected in parallel to the gate resistor R8. The field effect transistor Q7 includes a gate GQ7, a drain DQ7, and a source SQ7. The field effect transistor Q7 is a normally-off GaN-based GIT. The source SQ7 of the field effect transistor Q7 is connected to one end of the gate resistor R8 at the side of the field effect transistor Q6, and the drain DQ7 is connected to the other end of the gate resistor 8 at the side of the signal input terminal 13. The gate GQ7 and the source SQ7 are short-circuited, and thus, the field effect transistor Q7 functions as a diode. The field effect transistor Q7 is an element for increasing the turn-off speed of the field effect transistor Q6.

Described below is an example of the gate width of each of the semiconductor switching element 2 in the switch system 3f and the field effect transistors Q1, Q2, Q4 to Q7, and the circuit constant of each of the resistors R2 to R8 when the output voltage of a direct-current power supply 4 is, for example, 12 V.

The gate width of the semiconductor switching element 2 is, for example, 400 mm. The gate width of the first field effect transistor Q1 is, for example, 10 mm. The gate width of the second field effect transistor Q2 is, for example, 10 mm. The gate width of the field effect transistor Q4 is, for example, 0.1 mm. The gate width of the field effect transistor Q5 is, for example, 1 mm. The gate width of the field effect transistor Q6 is, for example, 10 mm. The gate width of the field effect transistor Q7 is, for example, 1 mm. The resistance value of the second gate resistor R2 is, for example, 1 kΩ. The resistance value of the resistor R3 is, for example, 5 kΩ. The resistance value of the resistor R4 is, for example, 2 kΩ. The resistance value of the resistor R5 constituting the impedance element 15 is, for example, 500Ω. The resistance value of the resistor R6 is, for example, 100Ω. The resistance value of the gate resistor R7 is, for example, 5 kΩ. The resistance value of the gate resistor R8 is, for example, 1 kΩ.

Figure 10:
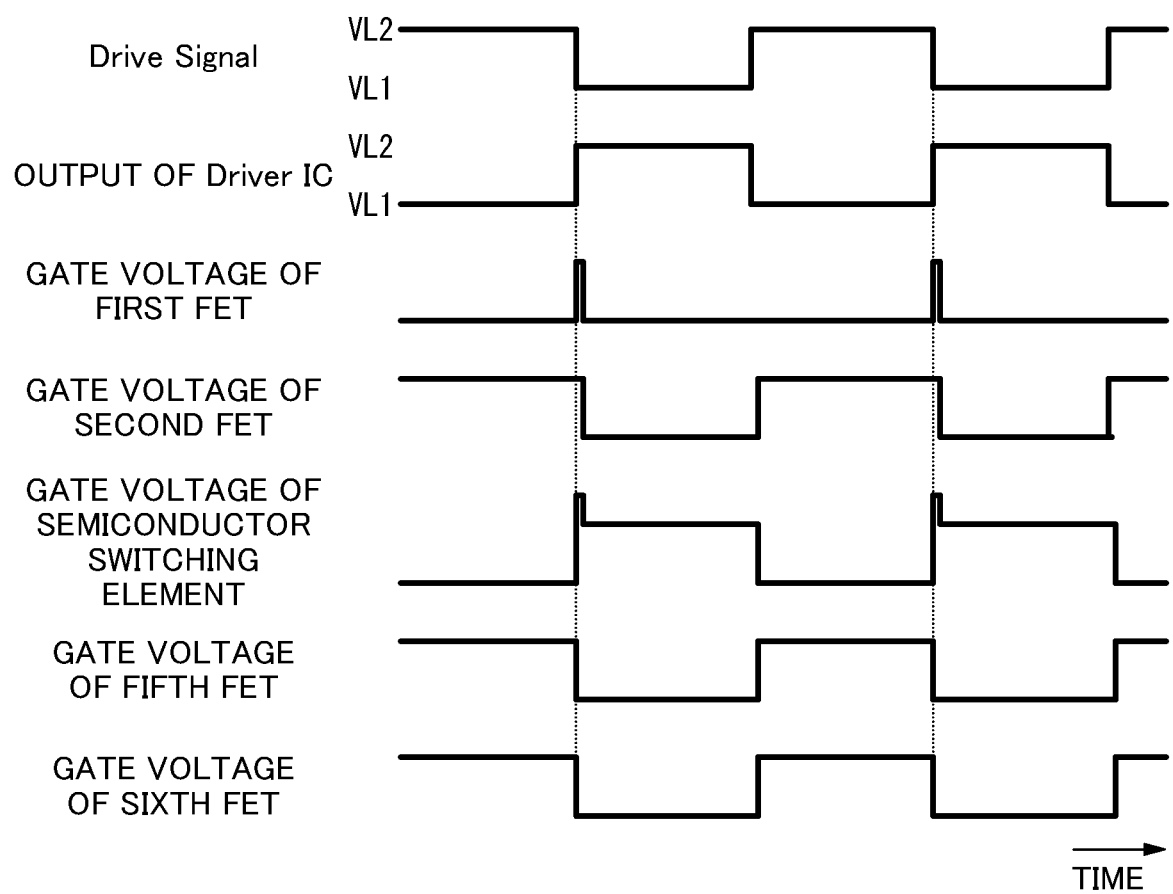
FIG. 10 is a timing diagram illustrating operation of the driver circuit according to the seventh embodiment.

FIG. 10 is a timing diagram schematically showing the relationship among the drive signal input to a signal source 6, the output signal of the driver IC 5, the gate voltage of the first field effect transistor Q1 (first FET), the gate voltage of the second field effect transistor Q2 (second FET), the gate voltage of the semiconductor switching element 2, the voltage between the drain and the source (drain-source voltage) of the semiconductor switching element 2, the gate voltage of the field effect transistor Q5 (fifth FET), and the gate voltage of the field effect transistor Q6 (sixth FET).

According to the first embodiment described above, when the potential level of a signal (the output signal from the driver IC 5) input to the signal input terminal 13 changes from the first potential level VL1 to the second potential level VL2 higher than the first potential level VL1 with the second field effect transistor Q2 being in the ON state, the first field effect transistor Q1 is on, and the driver circuit 1 thus causes a current larger than a current flowing through the impedance element 15 to flow through the gate 21 of the semiconductor switching element 2 such that the gate voltage of the semiconductor switching element 2 is increased to a value higher than the prescribed value Vg1 higher than the value of the threshold voltage of the semiconductor switching element 2, and thereafter, the driver circuit 1 keeps the current flowing through the gate 21 of the semiconductor switching element 2 via the impedance element 15 such that the semiconductor switching element 2 is in the normally ON state.

The driver circuit 1f and the switch system 3f according to the seventh embodiment, similarly to the driver circuit 1 and the switch system 3 according to the first embodiment, include a speed-up circuit 14 and can thus reduce the turn-on time of the semiconductor switching element 2 without including a capacitor of large capacitance.

Moreover, the driver circuit 1f according to the seventh embodiment includes the DCFL circuit 10 to enable the turn-off speed of the semiconductor switching element 2 to be increased.

Further, the driver circuit 1f according to the seventh embodiment includes the DCFL circuit 10 to be configured as a monolithic integrated circuit.

When the driver circuit 1f includes the field effect transistor Q4, the resistor R6 does not necessarily have to be provided. Moreover, when the driver circuit 1f includes the resistor R6, the field effect transistor Q4 does not necessarily have to be provided. When the field effect transistor Q4 is provided, a substantially constant current flows even when the output voltage of the direct-current power supply 4 changes, and thus, the driver circuit 1f is easy to use. When the output voltage of the direct-current power supply 4 is fixed, only the resistor R6 of the field effect transistor Q4 and the resistor R6 may be provided. When only the resistor R6 is provided, the resistance value of the resistor R6 is, for example, 10 kΩ.

Eighth Embodiment

Figure 11:
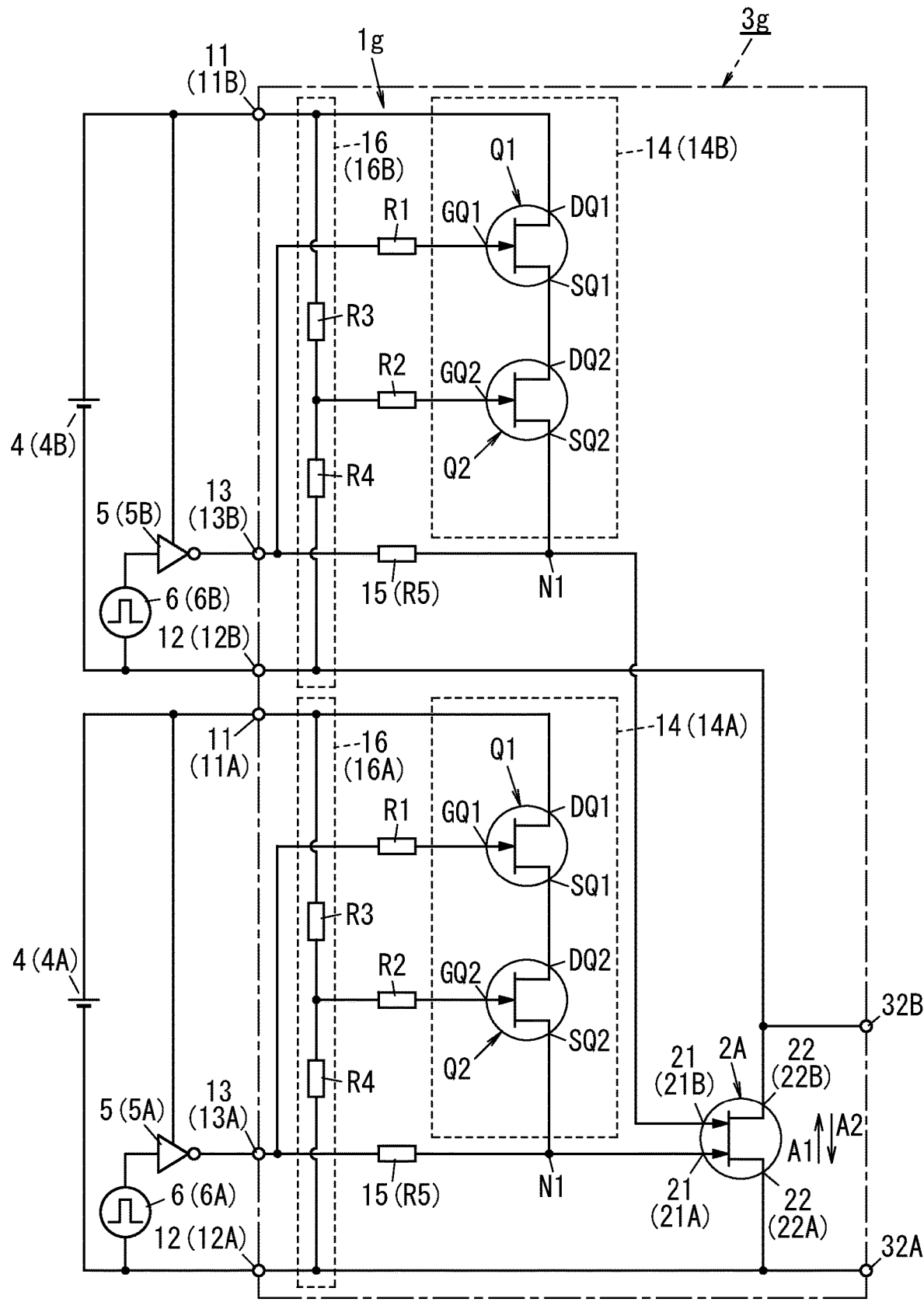
FIG. 11 is a circuit diagram of a switch system including a driver circuit according to an eighth embodiment.

A driver circuit 1g according to an eighth embodiment and a switch system 3g including the driver circuit 1g will be described below with reference to FIG. 11.

The driver circuit 1g according to the eighth embodiment is a driver circuit of a semiconductor switching element 2A of a current driven type. In the driver circuit 1g and the switch system 3g according to the eighth embodiment, components similar to those of the driver circuit 1 and the switch system 3 according to the first embodiment are denoted by the same reference signs as those in the first embodiment, and the description thereof is omitted.

The semiconductor switching element 2A is a dual gate-type bidirectional switching element including two gates 21 and two sources 22. The two gates 21 correspond to the two sources 22 on a one-to-one basis. In the following description, for convenience of explanation, one of the two gates 21 may be referred to as a first gate 21A and the other of the two gates 21 may be referred to as a second gate 21B. Moreover, of the two sources 22, one source 22 corresponding to the first gate 21A may be referred to as a first source 22A, and the other source 22 corresponding to the second gate 21B may be referred to as a second source 22B.

The semiconductor switching element 2A is briefly described and then, the driver circuit 1g and the switch system 3g are described below.

The semiconductor switching element 2A is one type of GaN-based GITs. The semiconductor switching element 2A includes, for example, a substrate, a buffer layer, a first nitride semiconductor layer, a second nitride semiconductor layer, a first source electrode, a first gate electrode, a second gate electrode, a second source electrode, a first p-type layer, and a second p-type layer. The buffer layer is provided on the substrate. The first nitride semiconductor layer is provided on the buffer layer. The second nitride semiconductor layer is provided on the first nitride semiconductor layer. The first source electrode, the first gate electrode, the second gate electrode, and the second source electrode are formed on the second nitride semiconductor layer. The first p-type layer is provided between the first gate electrode and the second nitride semiconductor layer. The second p-type layer is provided between the second gate electrode and the second nitride semiconductor layer. In the semiconductor switching element 2A, the first source 22A includes a first source electrode. The first gate 21A includes the first gate electrode and the first p-type layer. The second gate 21B includes the second gate electrode and the second p-type layer. The second source 22B includes the second source electrode. The substrate is, for example, a silicon substrate. The buffer layer is, for example, an undoped GaN layer. The first nitride semiconductor layer is, for example, an undoped GaN layer. The second nitride semiconductor layer is, for example, an undoped AlGaN layer. The first p-type layer and the second p-type layer are each, for example, a p-type AlGaN layer. Each of the buffer layer, the first nitride semiconductor layer, and the second nitride semiconductor layer may contain an impurity such as Mg, H, Si, C, or O which is inevitably incorporated into the layer during its growth by Metal Organic Vapor Phase Epitaxy (MOVPE) or the like.

In the semiconductor switching element 2A, the second nitride semiconductor layer, together with the first nitride semiconductor layer, forms a hetero junction part. In the vicinity of the hetero junction part, Two-Dimensional Electron Gas is generated in the first nitride semiconductor layer. An area including the two-dimensional electron gas (hereinafter also referred to as a "two-dimensional electron gas layer") may function as an n-channel layer (electron conducting layer).

In the following description, for convenience of explanation, a state where a voltage higher than or equal to the first threshold voltage (e.g., 1.3 V) is not applied between the first gate 21A and the first source 22A is also referred to as the first gate 21A being in the OFF state. Moreover, a state where a voltage higher than or equal to the first threshold voltage is applied between the first gate 21A and the first source 22A with the first gate 21A being at the high potential side is also referred to as that the first gate 21A being in the ON state. Further, a state where a voltage higher than or equal to the second threshold voltage (e.g., 1.3 V) is not applied between the second gate 21B and the second source 22B is also referred to as the second gate 21B being in the OFF state. Furthermore, a state where a voltage higher than or equal to the second threshold voltage is applied between the second gate 21B and the second source 22B with the second gate 21B being at the high potential side is also referred to as the second gate 21B being in the ON state.

The semiconductor switching element 2A includes the first p-type layer and the second p-type layer described above, thereby embodying a normally off-type transistor.

The semiconductor switching element 2A is switchable among a bidirectionally ON state, a bidirectionally OFF state, a first diode state, and a second diode state in accordance with a combination of the first gate voltage and the second gate voltage respectively applied to the first gate 21A and the second gate 21B. The first gate voltage is a voltage applied between the first gate 21A and the first source 22A. The second gate voltage is a voltage applied between the second gate 21B and the second source 22B. The bidirectionally ON state is a state where a current flows in two directions (a first direction A1 and a second direction A2 opposite to the first direction A1). The bidirectionally OFF state is a state where the bidirectional current is inhibited. The first diode state is a state where the current flows in the first direction A1. The second diode state is a state where the current flows in the second direction A2.

In the semiconductor switching element 2A, the bidirectionally ON state is achieved when the first gate 21A is in the ON state and the second gate 21B is in the ON state. In the semiconductor switching element 2A, the bidirectionally OFF state is achieved when the first gate 21A is in the OFF state and the second gate 21B is in the OFF state. In the semiconductor switching element 2A, the first diode state is achieved when the first gate 21A is in the OFF state and the second gate 21B is in the ON state. In the semiconductor switching element 2A, the second diode state is achieved when the first gate 21A is in the ON state and the second gate 21B is in the OFF state.

Next, the driver circuit 1g and the switch system 3g will be described.

The driver circuit 1g includes two speed-up circuits 14. In the following description, one speed-up circuit 14 of the two speed-up circuits 14 which is to be connected to the first gate 21A of the semiconductor switching element 2A may be referred to as a first speed-up circuit 14A, and the other speed-up circuit 14 which is to be connected to the second gate 21B may be referred to as a second speed-up circuit 14B.

The first speed-up circuit 14A and the second speed-up circuit 14B have the same circuit configuration.

The driver circuit 1g further includes two sets each including a power supply terminal 11, a ground terminal 12, and a signal input terminal 13, and the two sets correspond to the two speed-up circuits 14 on a one-to-one basis. In the following description, for convenience of explanation, the power supply terminal 11, the ground terminal 12, and the signal input terminal 13 of one of the two sets may be respectively referred to as a first power supply terminal 11A, a first ground terminal 12A, and a first signal input terminal 13A, and the power supply terminal 11, the ground terminal 12, and the signal input terminal 13 of the other of the two sets may be respectively referred to as a second power supply terminal 11B, a second ground terminal 12B, and a second signal input terminal 13B. The first power supply terminal 11A, the first ground terminal 12A, and the first signal input terminal 13A correspond to the first gate 21A and the first source 22A of the semiconductor switching element 2A. The second power supply terminal 11B, the second ground terminal 12B, and the second signal input terminal 13B correspond to the second gate 21B and the second source 22B of the semiconductor switching element 2A.

Moreover, the driver circuit 1g includes two resistor dividers 16. The two resistor dividers 16 correspond to the two sets on a one-to-one basis. In FIG. 11, the resistor divider 16 corresponding to the first power supply terminal 11A, the first ground terminal 12A, and the first signal input terminal 13A is defined as a first resistor divider 16A, and the resistor divider 16 corresponding to the second power supply terminal 11B, the second ground terminal 12B, and the second signal input terminal 13B is defined as a second resistor divider 16B.

Moreover, the driver circuit 1g includes two impedance elements 15. In the driver circuit 1g, one impedance element 15 of the two impedance elements 15 is provided between the first gate 21A and the first signal input terminal 13A, the other impedance element 15 is provided between the second gate 21B and the second signal input terminal 13B.

In the following description, for convenience of explanation, a direct-current power supply 4 which is to be connected between the first power supply terminal 11A and the first ground terminal 12A of the driver circuit 1g may be referred to as a first direct-current power supply 4A, and a direct-current power supply 4 which is to be connected between the second power supply terminal 11B and the second ground terminal 12B may be referred to as a second direct-current power supply 4B. Moreover, also in a series circuit of a signal source 6 and a driver IC 5 which is to be connected between the first signal input terminal 13A and the first ground terminal 12A of the driver circuit 1g, the driver IC 5 may be referred to as a first driver IC 5A, and the signal source 6 may be referred to as a first signal source 6A. Moreover, in a series circuit of a signal source 6 and a driver IC 5 which is to be connected between the second signal input terminal 13B and the second ground terminal 12B of the driver circuit 1g, the driver IC 5 may be referred to as a second driver IC 5B, and the signal source 6 may be referred to as a second signal source 6B.

The first direct-current power supply 4A and the second direct-current power supply 4B are the same in terms of the output voltage. However, the output voltage of the first direct-current power supply 4A and the output voltage of the second direct-current power supply 4B may be different from each other.

The first signal source 6A and the second signal source 6B are the same in terms of the second potential level VL2. However, the second potential level VL2 of the first signal source 6A and the second potential level VL2 of the second signal source 6B may be different from each other.

The driver circuit 1g and the switch system 3g according to the eighth embodiment include the two speed-up circuits 14, and therefore, the turn-on time of a semiconductor switching element 2A can be reduced without including a capacitor of large capacitance.

Moreover, when the driver circuit 1g according to the eighth embodiment is configured as a monolithic integrated circuit, the driver circuit 1g does not have to be provided with a capacitor of large capacitance and is thus downsized. Further, when the switch system 3g according to the eighth embodiment is configured as a monolithic integrated circuit, the switch system 3g does not have to be provided with a capacitor of large capacitance and is thus downsized.

The first to eighth embodiments described above are mere examples of various embodiments of the present disclosure. Various modifications of the first to eighth embodiments are possible depending on design and the like as long as the object of the present disclosure is be achieved.

For example, the resistor divider 16 in the driver circuit 1 according to the first embodiment includes at least two resistors R3 and R4. The resistor divider 16 in the driver circuit 1 according to the first embodiment may have a configuration including a series connection of three or more resistors.

Moreover, the speed-up circuit 14 may include one or more field effect transistors connected in series or in parallel to the second field effect transistor Q2 in addition to the first field effect transistor Q1 and the second field effect transistor Q2.

Further, the circuit configuration of each of the constant current circuit 17, the constant voltage circuit 18, and the constant current circuit 19 is a mere example and is not particularly limited to this example. However, adopting this configuration facilitates the formation of the monolithic integrated circuit.

Furthermore, the p-type layer in the semiconductor switching element 2 of each of the switch systems 3 to 3*f* is not limited to the p-type AlGaN layer but may be, for example, a p-type GaN layer or a p-type metal oxide semiconductor layer. The p-type metal oxide semiconductor layer is, for example, a NiO layer. The NiO layer may contain, as an impurity, for example, at least one kind of alkali metal selected from the group consisting of lithium, sodium, potassium, rubidium, and cesium. Moreover, the NiO layer may contain, for example, transition metal, such as silver or copper, which becomes monovalent when added as the impurity. Each of the first p-type layer and the second p-type layer of the semiconductor switching element 2A of the switch system 3*g* is similar to the p-type layer of the semiconductor switching element 2.

Each of the semiconductor switching element 2 and the semiconductor switching element 2A may include one or more nitride semiconductor layers between the buffer layer and the first nitride semiconductor layer. Moreover, the buffer layer is not limited to the single layer structure but may have, for example, a superlattice structure.

Moreover, the substrate of each of the semiconductor switching element 2 and the semiconductor switching element 2A is not limited to the silicon substrate but may be, for example, a GaN substrate, a SiC substrate, or a sapphire substrate.

The semiconductor switching element 2A is applicable to, for example, an electrical device such as a multilevel inverter, a dimmer, a matrix converter configured to perform alternating current-alternating current electric power conversion.

Aspects

The embodiment and the like described above in the present disclosure discloses the following aspects.

A driver circuit (1; 1*a*; 1*b*; 1*c*; 1*d*; 1*e*; 1*f*; 1*g*) according to a first aspect is a driver circuit for a semiconductor switching element (2; 2A) of a current driven type, the semiconductor switching element including a gate (21) and a source (22) corresponding to the gate (21). The driver circuit includes a power supply terminal (11), a ground terminal (12), a signal input terminal (13), a speed-up circuit (14; 14*c*; 14*d*), and an impedance element (15). The ground terminal (12) is configured to be connected to the source (22; 22A, 22B) of the semiconductor switching element (2; 2A). The speed-up circuit (14; 14*c*; 14*d*) is to be provided between the power supply terminal (11; 11A, 11B) and the gate (21) of the semiconductor switching element (2; 2A). The impedance element (15) is to be provided between the signal input terminal (13; 13A, 13B) and a node (N1), the node (N1) being between the speed-up circuit (14; 14*c*; 14*d*) and the gate (21) of the semiconductor switching element (2; 2A). The speed-up circuit (14; 14*c*; 14*d*) includes a first field effect transistor (Q1) and a second field effect transistor (Q2; Q2*d*). The second field effect transistor (Q2; Q2*d*) is connected in series to the first field effect transistor (Q1) and is configured to be connected to the gate (21) of the semiconductor switching element (2; 2A). The impedance element (15) has an impedance higher than an impedance of the speed-up circuit (14; 14*c*; 14*d*) when both the first field effect transistor (Q1) and the second field effect transistor (Q2; Q2*d*) are in an ON state.

The driver circuit (1; 1*a*; 1*b*; 1*c*; 1*d*; 1*e*; 1*f*; 1*g*) of the first aspect reduces the turn-on time of the semiconductor switching element (2; 2A) without including a capacitor of large capacitance.

A driver circuit (1; 1*c*; 1*d*; 1*f*; 1*g*) of a second aspect referring to the first aspect further includes a resistor divider (16). The resistor divider (16) is provided between the power supply terminal (11) and the ground terminal (12). The second field effect transistor (Q2) has a gate (Q2G) connected to an output end (161) of the resistor divider (16).

In the driver circuit (1; 1*c*; 1*d*; 1*f*; 1*g*) according to the second aspect, the resistor divider (16) determines the gate voltage of the second field effect transistor (Q2).

A driver circuit (1*a*) of a third aspect referring to the first aspect further includes a resistor (R3) and a constant current circuit (17). The resistor (R3) is connected to the power supply terminal (11). The constant current circuit (17) is provided between the resistor (R3) and the ground terminal (12). The second field effect transistor (Q2) has a gate (Q2G) connected to a node (N2) between the resistor (R3) and the constant current circuit (17).

The driver circuit (1*a*) of the third embodiment suppresses a current, which flows from a direct-current power supply (4) configured to be connected between the power supply terminal (11) and the ground terminal (12) through the power supply terminal (11) and a first field effect transistor (Q1) to a second field effect transistor (Q2), to the current of the constant current circuit (17), and the driver circuit (1*a*) thus reduces the electric power loss.

A driver circuit (1*b*) of a fourth aspect referring to the first aspect further includes a resistor (R3) and a constant voltage circuit (18). The resistor (R3) is connected to the power supply terminal (11). The constant voltage circuit (18) is provided between the resistor (R3) and the ground terminal (12). The constant voltage circuit (18) includes a plurality of diodes (D1) connected in series to each other. In the driver circuit (1*b*), the second field effect transistor (Q2) has a gate (GQ2) connected to a node (N3) between the resistor (R3) and the constant voltage circuit (18).

The driver circuit (1*b*) of the fourth aspect suppresses an excessively high gate voltage from being applied to the second field effect transistor (Q2) regardless of the magnitude of a voltage applied between the power supply terminal (11) and the ground terminal (12).

In a driver circuit (1*c*) of a fifth aspect referring to the second aspect, the second field effect transistor (Q2) includes a third field effect transistor (Q21) and a fourth field effect transistor (Q22) which are in Darlington connection. The third field effect transistor (Q21) includes a gate (GQ21) and a source (SQ21). The fourth field effect transistor (Q22) includes a gate (GQ22) and a source (SQ22). The fourth field effect transistor (Q22) has a current capacity greater than a current capacity of the third field effect transistor (Q21). The gate (GQ21) of the third field effect transistor (Q21) is connected to the output end (161) of the resistor divider (16). The source (SQ22) of the fourth field effect transistor (Q22) is configured to be connected to the gate (21) of the semiconductor switching element (2).

The driver circuit (1c) according to the fifth aspect enables the current amplification factor of the second field effect transistor (Q2) to be increased, and therefore, the resistors (R3, R4) of the resistor divider (16) each have an increased resistance value. Thus, the driver circuit (1c) of the fifth aspect enables the electric power loss to be reduced.

In a driver circuit (1d) according to a sixth aspect referring to any one of the first to fifth aspects, the second field effect transistor (Q2d) is a normally-on field effect transistor.

The driver circuit (1d) according to the sixth aspect enables the gate voltage of the first field effect transistor (Q1) to be increased also when a voltage applied between the power supply terminal (11) and the ground terminal (12) is small (e.g., 5 V).

A driver circuit (1e) of a seventh aspect referring to the first aspect further includes a constant current circuit (19) and a resistor (R4). The constant current circuit (19) is connected to the power supply terminal (11). The resistor (R4) is provided between the constant current circuit (19) and the ground terminal (12). The second field effect transistor (Q2) has a gate (GQ2) connected to a node (N4) between the constant current circuit (19) and the resistor (R4).

The driver circuit (1e) according to the seventh aspect enables a current flowing through the second field effect transistor (Q2) to be restricted also when a voltage applied between the power supply terminal (11) and the ground terminal (12) changes, so that the electric power loss is reduced and that the gate voltage of the second field effect transistor (Q2) is stabilized.

A driver circuit (1f) according to an eighth aspect referring to any one of the first to seventh aspects further includes a DCFL circuit (10). The DCFL circuit (10) includes an input end (101) and an output end (102) and is provided between the power supply terminal (11) and the ground terminal (12). The input end (101) of the DCFL circuit (10) is connected to the signal input terminal (13). The output end (102) of the DCFL circuit (10) is configured to be connected via the impedance element (15) to the gate (21) of the semiconductor switching element (2).

The driver circuit (1f) of the eighth aspect enables the turn-off time of the semiconductor switching element (2) to be reduced.

In a driver circuit (1g) according to a ninth aspect referring to any one of the first to eighth aspects, the gate (21) is one of two gates (21), the source (22) is one of two sources (22), and the semiconductor switching element (2A) is a dual-gate bidirectional switch element including the two gates (21) and the two sources (22). The speed-up circuit (14) is one of two speed-up circuits (14) of the driver circuit (1g). One speed-up circuit (14) of the two speed-up circuits (14) is configured to be connected to a first gate (21A) which is one gate (21) of the two gates (21). The other speed-up circuit (14) of the two speed-up circuits (14) is configured to be connected to a second gate (21B) which is the other gate (21) of the two gates (21).

The driver circuit (1g) of the ninth aspect enables the turn-on time of the semiconductor switching element (2A) to be reduced.

In a driver circuit (1; 1a; 1b; 1c; 1d; 1e; 1f; 1g) of a tenth aspect referring to any one of the first to ninth aspects, the semiconductor switching element (2; 2A) is a GaN-based semiconductor switching element.

The driver circuit (1; 1a; 1b; 1c; 1d; 1e; 1f; 1g) of the tenth aspect enables the turn-on time of the semiconductor switch (2; 2A), which is a GaN-based semiconductor switch, to be reduced.

A driver circuit (1; 1a; 1b; 1c; 1d; 1e; 1f; 1g) according to an eleventh aspect is a driver circuit for a semiconductor switching element (2; 2A) of a current driven type, the semiconductor switching element including a gate (21) and a source (22) corresponding to the gate (21). The driver circuit (1; 1a; 1b; 1c; 1d; 1e; 1f; 1g) includes a power supply terminal (11), a ground terminal (12), a signal input terminal (13), a first field effect transistor (Q1), a second field effect transistor (Q2; Q2d), and an impedance element (15). The ground terminal (12) is configured to be connected to the source (22) of the semiconductor switching element (2; 2A). The first field effect transistor (Q1) is connected to the power supply terminal (11). The second field effect transistor (Q2; Q2d) is connected in series to the first field effect transistor (Q1) and is configured to be connected to the gate (21) of the semiconductor switching element (2; 2A). The impedance element (15) is configured to be provided between the signal input terminal (13) and a node (N1), the node (N1) being between the second field effect transistor (Q2; Q2d) and the gate (21) of the semiconductor switching element (2; 2A). The driver circuit (1; 1a; 1b; 1c; 1d; 1e; 1f; 1g) is configured such that when a voltage level of a signal input to the signal input terminal (13) changes from a first potential level (VL1) to a second potential level (VL2) higher than the first potential level (VL1) with the second field effect transistor (Q2; Q2d) being in an ON state, the first field effect transistor (Q1) is on, and the driver circuit (1; 1a; 1b; 1c; 1d; 1e; 1f; 1g) thus causes a current larger than a current flowing through the impedance element (15) to flow through the gate (21) of the semiconductor switching element (2; 2A) such that the gate voltage of the semiconductor switching element (2; 2A) is increased to a value higher than a prescribed value (Vg1) higher than a value of the threshold voltage, and thereafter, the driver circuit (1; 1a; 1b; 1c; 1d; 1e; 1f; 1g) keeps the current flowing through the gate (21) of the semiconductor switching element (2; 2A) via the impedance element (15) from the signal input terminal (13) such that the semiconductor switching element (2; 2A) is in the normally ON state.

The driver circuit (1; 1a; 1b; 1c; 1d; 1e; 1f; 1g) of the eleventh aspect reduces the turn-on time of the semiconductor switching element (2; 2A) without including a capacitor of large capacitance.

In a driver circuit (1; 1a; 1b; 1c; 1d; 1e; 1f; 1g) of a twelfth aspect referring to any one of the first to eleventh aspects, the driver circuit (1; 1a; 1b; 1c; 1d; 1e; 1f; 1g) is a monolithic integrated circuit.

The driver circuit (1; 1a; 1b; 1c; 1d; 1e; 1f; 1g) of the twelfth aspect is downsized.

A switch system (3; 3a; 3b; 3c; 3d; 3e; 3f; 3g) of a thirteenth aspect includes the driver circuit (1; 1a; 1b; 1c; 1d; 1e; 1f; 1g); and the semiconductor switching element (2; 2A) of any one of the first to eleventh aspects.

The switch system (3; 3a; 3b; 3c; 3d; 3e; 3f; 3g) of the thirteenth aspect reduces the turn-on time of the semiconductor switching element (2; 2A) without including a capacitor of large capacitance.

In a switch system (3; 3a; 3b; 3c; 3d; 3e; 3f; 3g) of a fourteenth aspect referring to the thirteenth aspect, the driver circuit (1; 1a; 1b; 1c; 1d; 1e; 1f; 1g) is a monolithic integrated circuit.

In the switch system (3; 3a; 3b; 3c; 3d; 3e; 3f; 3g) of the fourteenth aspect, the driver circuit (1; 1a; 1b; 1c; 1d; 1e; 1f; 1g) is downsized.

In a switch system (3; 3a; 3b; 3c; 3d; 3e; 3f; 3g) of a fifteenth aspect referring to the thirteenth aspect, the switch system (3; 3a; 3b; 3c; 3d; 3e; 3f; 3g) is a monolithic integrated circuit including the driver circuit (1; 1a; 1b; 1c; 1d; 1e; 1f; 1g) and the semiconductor switching element (2; 2A) integrated with each other.

The switch system (3; 3a; 3b; 3c; 3d; 3e; 3f; 3g) of the fifteenth aspect is downsized.

REFERENCE SIGNS LIST 1, 1a, 1b, 1c, 1d, 1e, 1f, 1g Driver Circuit
2, 2A Semiconductor Switching Element
21 Gate
21A First Gate
21B Second Gate
22 Source
22A First Source
22B Second Source
3, 3a, 3b, 3c, 3d, 3e, 3f, 3g Switch System
10 DCFL Circuit
101 Input End
102 Output End
11 Power Supply Terminal
12 Ground Terminal
13 Signal Input Terminal
14, 14c, 14d Speed-Up Circuit
15 Impedance Element
16 Resistor Divider
161 Output End
17 Constant Current Circuit
18 Constant Voltage Circuit
19 Constant Current Circuit
D1 Diode
N1 Node
N2 Node
Q1 First Field Effect Transistor
Q2, Q2d Second Field Effect Transistor
Q21 Third Field Effect Transistor
Q22 Fourth Field Effect Transistor
Vg1 Prescribed Value
VL1 First Potential Level
VL2 Second Potential Level

The invention claimed is:

1. A driver circuit for a semiconductor switching element of a current driven type, the semiconductor switching element including a gate and a source corresponding to the gate, the driver circuit comprising:
   a power supply terminal;
   a ground terminal configured to be connected to the source of the semiconductor switching element;
   a signal input terminal;
   a speed-up circuit configured to be provided between the power supply terminal and the gate of the semiconductor switching element; and
   an impedance element configured to be provided between the signal input terminal and a node, the node being between the speed-up circuit and the gate of the semiconductor switching element,
   the speed-up circuit including
      a first field effect transistor and
      a second field effect transistor connected in series to the first field effect transistor, the second field effect transistor being configured to be connected to the gate of the semiconductor switching element,
   the impedance element having an impedance higher than an impedance of the speed-up circuit when both the first field effect transistor and the second field effect transistor are in an ON state.

2. The driver circuit of claim 1, further comprising a resistor divider provided between the power supply terminal and the ground terminal, wherein
   the second field effect transistor has a gate connected to an output end of the resistor divider.

3. The driver circuit of claim 2, wherein
   the second field effect transistor includes a third field effect transistor and a fourth field effect transistor which are in Darlington connection, the third field effect transistor including a gate, a drain, and a source, the fourth field effect transistor including a gate, drain, and a source, the fourth field effect transistor having a current capacity greater than a current capacity of the third field effect transistor,
   the gate of the third field effect transistor is connected to the output end of the resistor divider, and
   the source of the fourth field effect transistor is configured to be connected to the gate of the semiconductor switching element.

4. The driver circuit of claim 1, further comprising:
   a resistor connected to the power supply terminal; and
   a constant current circuit provided between the resistor and the ground terminal, wherein
   the second field effect transistor has a gate connected to a node between the resistor and the constant current circuit.

5. The driver circuit of claim 1, further comprising:
   a resistor connected to the power supply terminal; and
   a constant voltage circuit provided between the resistor and the ground terminal, wherein
   the constant voltage circuit includes a plurality of diodes connected in series to each other, and
   the second field effect transistor has a gate connected to a node between the resistor and the constant voltage circuit.

6. The driver circuit of claim 1, wherein
   the second field effect transistor is a normally-on field effect transistor.

7. The driver circuit of claim 1, further comprising:
   a constant current circuit connected to the power supply terminal; and
   a resistor provided between the constant current circuit and the ground terminal, wherein
   the second field effect transistor has a gate connected to a node between the constant current circuit and the resistor.

8. The driver circuit of claim 1, further comprising an DCFL circuit including an input end and an output end and provided between the power supply terminal and the ground terminal, wherein
   the input end of the DCFL circuit is connected to the signal input terminal, and
   the output end of the DCFL circuit is configured to be connected via the impedance element to the gate of the semiconductor switching element.

9. The driver circuit of claim 1, wherein
   the gate is one of two gates, and the source is one of two sources,
   the semiconductor switching element is a dual-gate bidirectional switch element including the two gates and the two sources, the speed-up circuit is one of two speed-up circuits of the driver circuit, and
one speed-up circuit of the two speed-up circuits is connected to a first gate which is one gate of the two gates, and the other speed-up circuit of the two speed-up circuits is connected to a second gate which is the other gate of the two gates.

10. The driver circuit of claim 1, wherein
the semiconductor switching element is a GaN-based semiconductor switching element.

11. The driver circuit of claim 1, wherein
the driver circuit is a monolithic integrated circuit.

12. A switch system, comprising:
the driver circuit of claim 1; and
the semiconductor switching element of claim 1.

13. The switch system of claim 12, wherein
the driver circuit is a monolithic integrated circuit.

14. The switch system of claim 12, wherein
the switch system is a monolithic integrated circuit including the driver circuit and the semiconductor switching element integrated with each other.

15. A driver circuit for a semiconductor switching element of a current driven type, the semiconductor switching element including a gate and a source corresponding to the gate, the driver circuit comprising:
a power supply terminal;
a ground terminal configured to be connected to the source of the semiconductor switching element;
a signal input terminal;
a first field effect transistor connected to the power supply terminal;
a second field effect transistor connected in series to the first field effect transistor and configured to be connected to the gate of the semiconductor switching element; and
an impedance element configured to be provided between the signal input terminal and a node, the node being between the second field effect transistor and the gate of the semiconductor switching element,
the driver circuit being configured such that when a voltage level of a signal input to the signal input terminal changes from a first potential level to a second potential level higher than the first potential level with the second field effect transistor being in an ON state,
the first field effect transistor is on, and the driver circuit thus causes a current larger than a current flowing through the impedance element to flow through the gate of the semiconductor switching element such that the gate voltage of the semiconductor switching element is increased to a value higher than a prescribed value higher than a value of the threshold voltage, and thereafter,
the driver circuit keeps the current flowing through the gate of the semiconductor switching element via the impedance element from the signal input terminal such that the semiconductor switching element is in the normally ON state.

* * * * *